(12) United States Patent
Kolar et al.

(10) Patent No.: US 7,286,389 B2
(45) Date of Patent: Oct. 23, 2007

(54) LOW-POWER, P-CHANNEL ENHANCEMENT-TYPE METAL-OXIDE SEMICONDUCTOR FIELD-EFFECT TRANSISTOR (PMOSFET) SRAM CELLS

(75) Inventors: Pramod Kolar, Durham, NC (US); Hisham Z. Massoud, Durham, NC (US)

(73) Assignee: Duke University, Durham, NC (US)

( * ) Notice: Subject to any disclaimer, the term of this patent is extended or adjusted under 35 U.S.C. 154(b) by 0 days.

(21) Appl. No.: 11/186,395

(22) Filed: Jul. 21, 2005

(65) Prior Publication Data

US 2006/0018147 A1    Jan. 26, 2006

Related U.S. Application Data

(60) Provisional application No. 60/589,771, filed on Jul. 21, 2004.

(51) Int. Cl.
*G11C 11/412* (2006.01)

(52) U.S. Cl. .................. 365/154; 365/156; 365/227; 257/393; 257/903

(58) Field of Classification Search .......... 365/154, 365/156, 227, 206; 257/393, 903, 904
See application file for complete search history.

(56) References Cited

U.S. PATENT DOCUMENTS 4,990,974 A * 2/1991 Vinal ................. 257/403
5,222,039 A * 6/1993 Vinal ................. 365/156
5,635,731 A * 6/1997 Ashida ............... 257/67
5,870,330 A * 2/1999 Chan et al. .......... 365/154
6,141,240 A * 10/2000 Madan et al. ........ 365/156
2004/0001373 A1  1/2004 Liaw et al. .......... 365/200

FOREIGN PATENT DOCUMENTS

WO    WO 2006/012444 A2 *  2/2006

OTHER PUBLICATIONS

International Search Report with Written Opinion dated Oct. 23, 2006.
International Preliminary Report on Patentability dated Feb. 1, 2007.

* cited by examiner

*Primary Examiner*—Andrew Q. Tran
(74) *Attorney, Agent, or Firm*—Jenkins, Wilson, Taylor & Hunt, P.A.

(57) ABSTRACT

Low-power, all-p-channel enhancement-type metal-oxide semiconductor field-effect transistor (PMOSFET) SRAM cells are disclosed. A PMOSFET SRAM cell is disclosed. The SRAM cell can include a latch having first and second PMOSFETs for storing data. Further, a gate of the first PMOSFET is connected to a drain of the second PMOSFET at a first memory node. A gate of the second PMOSFET is connected to a drain of the first PMOSFET at a second memory node. The SRAM cell can also include third and fourth PMOSFETs forming a pull-down circuit. A source of the third PMOSFET is connected to the first memory node. Further, a source of the fourth PMOSFET is connected to the second memory node. The SRAM cell can include access circuitry for accessing data at the first and second memory nodes for read or write operations.

30 Claims, 21 Drawing Sheets

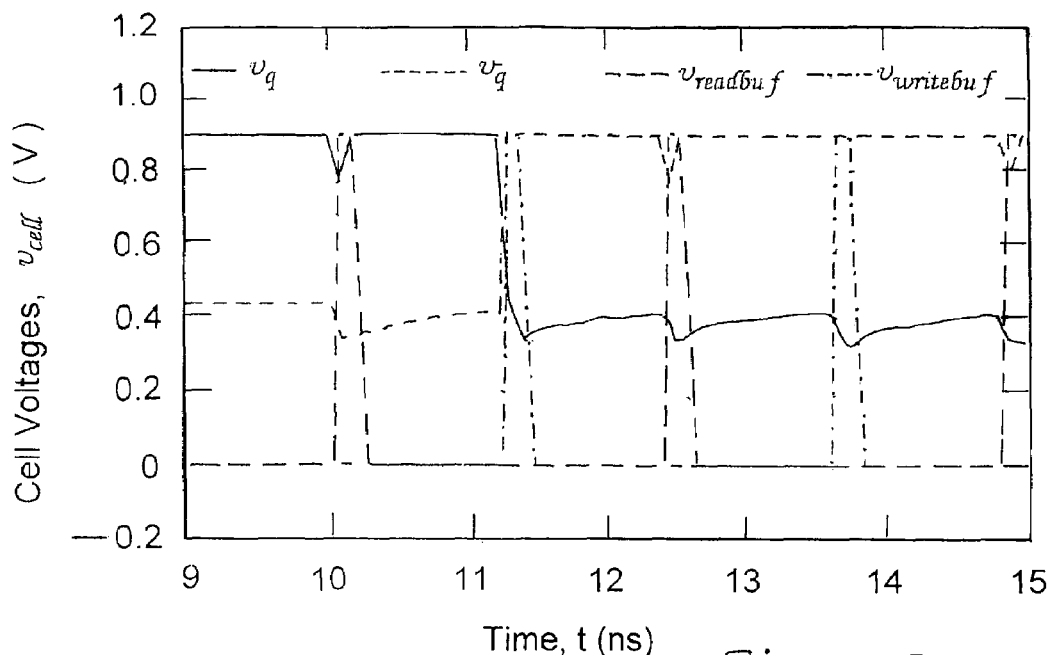
FIG · 8A
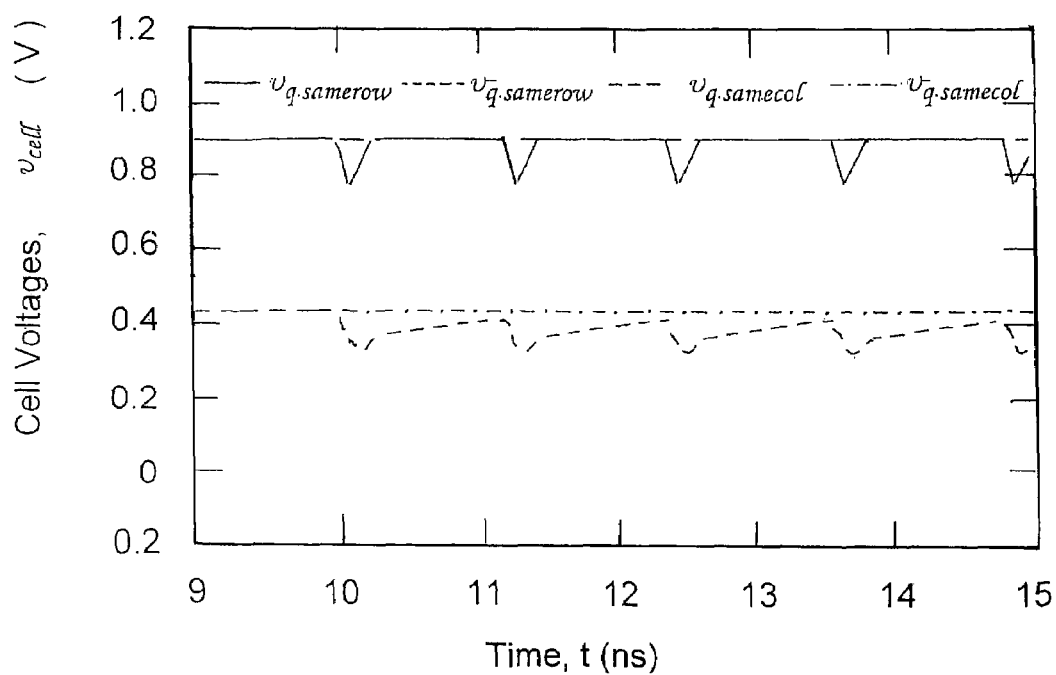
FIG · 8B

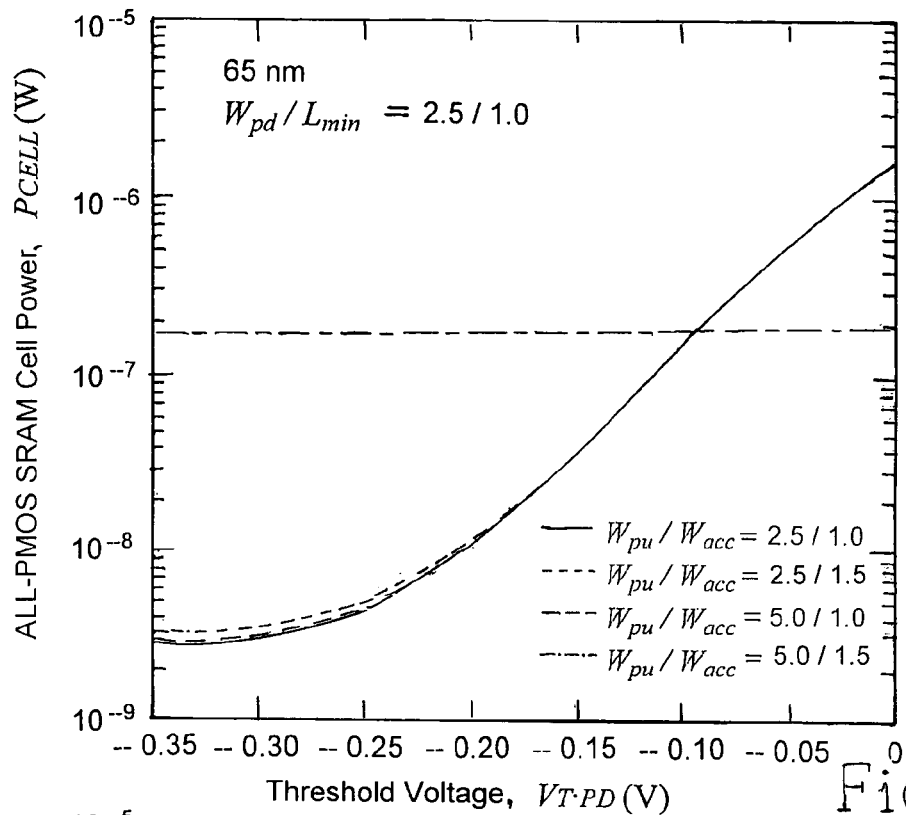
FiG·12A
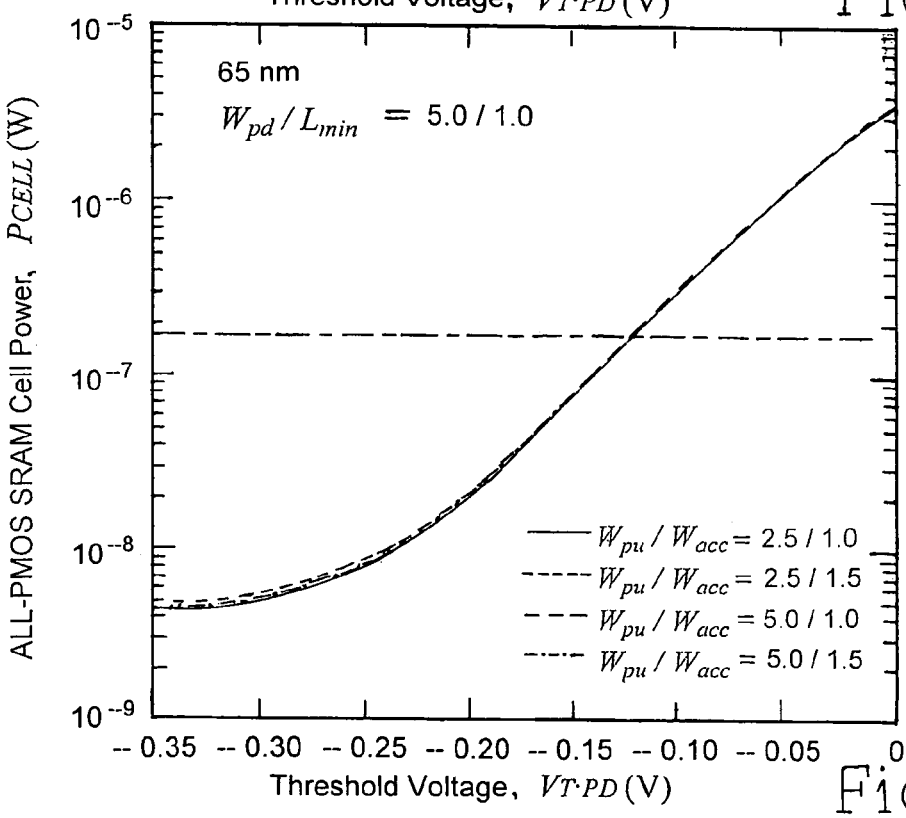
FiG·12B

LOW-POWER, P-CHANNEL ENHANCEMENT-TYPE METAL-OXIDE SEMICONDUCTOR FIELD-EFFECT TRANSISTOR (PMOSFET) SRAM CELLS

RELATED APPLICATIONS

This application claims the benefit of U.S. Provisional Patent Application Ser. No. 60/589,771, filed Jul. 21, 2004, the disclosure of which is incorporated herein by reference in its entirety.

TECHNICAL FIELD

The subject matter disclosed herein relates generally to static random access memory (SRAM) cells. More particularly, the subject matter disclosed herein relates to low-power, PMOSFET SRAM cells.

BACKGROUND

Digital systems typically need to constantly read and store digital data during operations. Therefore, memory units with the function of storing data are important elements in a digital system. Static random access memory (SRAM) cells and dynamic random access memory (DRAM) are important classes of volatile memory.

SRAMs are widely used where fast data access is needed such as the Level 1 cache in a microprocessor. Further, SRAMs have applications in mobile technologies such as cell phones and laptop computers where fast data access is desired. SRAMs typically occupy more chip area than DRAMs but provide the advantage of fast data access and simple peripheral circuitry. Unlike DRAMs, SRAMs consume much less standby power, thus making them attractive for mobile technologies where battery power is limited.

FIG. 1 illustrates a circuit diagram of a conventional SRAM column 100. Referring to FIG. 1, SRAM column 100 includes SRAM cells 102 and 104. SRAM cell 102 includes metal-oxide semiconductor field-effect transistors (MOSFETs) 106, 108, 110, and 112. Transistors 106 and 110 are p-channel enhancement-type MOSFETs (PMOSFETs). Transistors 108 and 112 are n-channel enhancement-type MOSFETs (NMOSFETs). The gates of transistors 106 and 108 are connected together at a memory node 114. The gates of transistors 110 and 112 are connected together at a memory node 116. The drains of transistors 110 and 112 are connected to memory node 114. Further, the drains of transistors 106 and 108 are connected to memory node 116. SRAM cell 104 is represented as a block and includes the same components and connections as SRAM cell 106.

Referring to FIG. 1, SRAM cell 102 can be accessed for reading or writing by raising the voltage of a word line 118, thus turning on NMOSFET access transistors 120 and 122. In this way, memory nodes 114 and 116 can be connected to bit lines 124 and 126, respectively. A sense amplifier, read buffers, and write buffers (represented by block 128) can be utilized for reading and writing data to SRAM cell 102 via bit lines 124 and 126.

FIGS. 2 and 3 illustrates waveform timing diagrams for control signals applied to SRAM column 100 of FIG. 1 for read and write operations, respectively. Referring to FIGS. 2 and 3, a precharge (PC) signal is a signal applied to transistors 130 and 132 for charging bit lines 126 and 124, respectively. A column-select (CS) signal is enabled and applied to column selectors 134 and 136 for selecting the column of SRAM column 100. After the PC signal is disabled, a word line (WL) signal is applied to transistors 120 and 122 for connecting nodes 114 and 116 to bit lines 124 and 126. As a result, the logic values at nodes 114 and 116, a differential voltage, appear on bit lines 124 and 126. The time required for the differential voltage signal to reach a certain certain predetermined value is $\Delta t$. A RdSa signal can be applied for turning sense amplifier 128 on. The data signal shown in FIG. 2 indicates when data is available for reading. The state signal shown in FIG. 3 indicates the logic state of the SRAM column.

Sizing transistors in an SRAM cell is important for minimizing area requirements. Minimization of the total cell area can be important because a typical SRAM has a large number of cells, typically on the order of $10^6$ cells per SRAM array. The sizes of the transistors should be selected such that the read operation does not upset the data stored in the cell. At the same time, a write operation to the cell should result in a change of the logic state of the cell. The requirements for the design of an SRAM cell for read and write operations are conflicting. Making the cell more stable to prevent read upsets may result in making the write operation to that cell more difficult. Sizing the transistors to enable easy write operations results in making the cell more prone to read upsets.

Static power consumption is another concern with regard to SRAM cells. Gate oxide tunneling can have a substantial impact on static power consumption in SRAM cells. Static power consumption can be reduced by adding transistors. However, increasing the number of transistors will increase the area requirements of the cell. Thus, it is desired to reduce static power consumption without increasing the transistor count in SRAM cells. In addition, it is desired to reduce static power consumption with negligible impact on static noise margin and access times.

Accordingly, there is a need to provide SRAM cells having reduced size requirements and static power consumption. Further, there is a need for SRAM cells with improved noise margin and access times.

SUMMARY

According to one aspect, the subject matter described herein comprises low-power, PMOSFET SRAM cells. One PMOSFET SRAM cell can include a latch having first and second PMOSFETs for storing data. Further, a gate of the first PMOSFET is connected to a drain of the second PMOSFET at a first memory node. A gate of the second PMOSFET is connected to a drain of the first PMOSFET at a second memory node. The SRAM cell can also include third and fourth PMOSFETs forming a pull-down circuit. A source of the third PMOSFET is connected to the first memory node. Further, a source of the fourth PMOSFET is connected to the second memory node. The SRAM cell can include access circuitry for accessing data at the first and second memory nodes for read or write operations.

According to another aspect, the subject matter described herein includes a memory cell array. The memory cell array can include a plurality of SRAM cells and access circuitry for selectively accessing memory nodes of the different SRAM cells for read and write operations. The SRAM cells can include a latch having first and second PMOSFETs for storing data. Further, a gate of the first PMOSFETs can be connected to a drain of the second PMOSFET at a first memory node. A gate of the second PMOSFET can be connected to a drain of the first PMOSFET at a second memory node. The SRAM cells can also include third and fourth PMOSFETs forming a pull-down circuit. A source of the third PMOSFET can be connected to the first memory node. A source of the fourth PMOSFET can be connected to the second memory node.

BRIEF DESCRIPTION OF THE DRAWINGS

Exemplary embodiments of the subject matter will now be explained with reference to the accompanying drawings, of which:

FIG. 8A is a timing diagram of test results of a read-write-read-write operation on a PMOSFET SRAM cell array having a 45 nm node according to the subject matter described herein;

FIG. 8B is another timing diagram of test results of a read-write-read-write operation on a PMOSFET SRAM cell array having a 45 nm node according to the subject matter described herein;

FIG. 12A is a graph of PMOSFET SRAM cell power versus threshold voltage for a 65 nm node according to the subject matter described herein;

FIG. 12B is another graph of PMOSFET SRAM cell power versus threshold voltage for a 65 nm node according to the subject matter described herein;

DETAILED DESCRIPTION

Static random-access memory (SRAM) cells including p-channel enhancement-type metal-oxide semiconductor field-effect transistors (PMOSFETs) are disclosed. According to one embodiment, the SRAM cell is comprised only of interconnected PMOSFETs. The impact of tunneling induced static power dissipation can be substantially reduced by using only PMOSFETs. Since PMOSFETs have a low tunneling current, tunneling leakage can be suppressed. Further, tunneling leakage can be reduced without a significant impact on static noise margin and access times.

Figure 1:
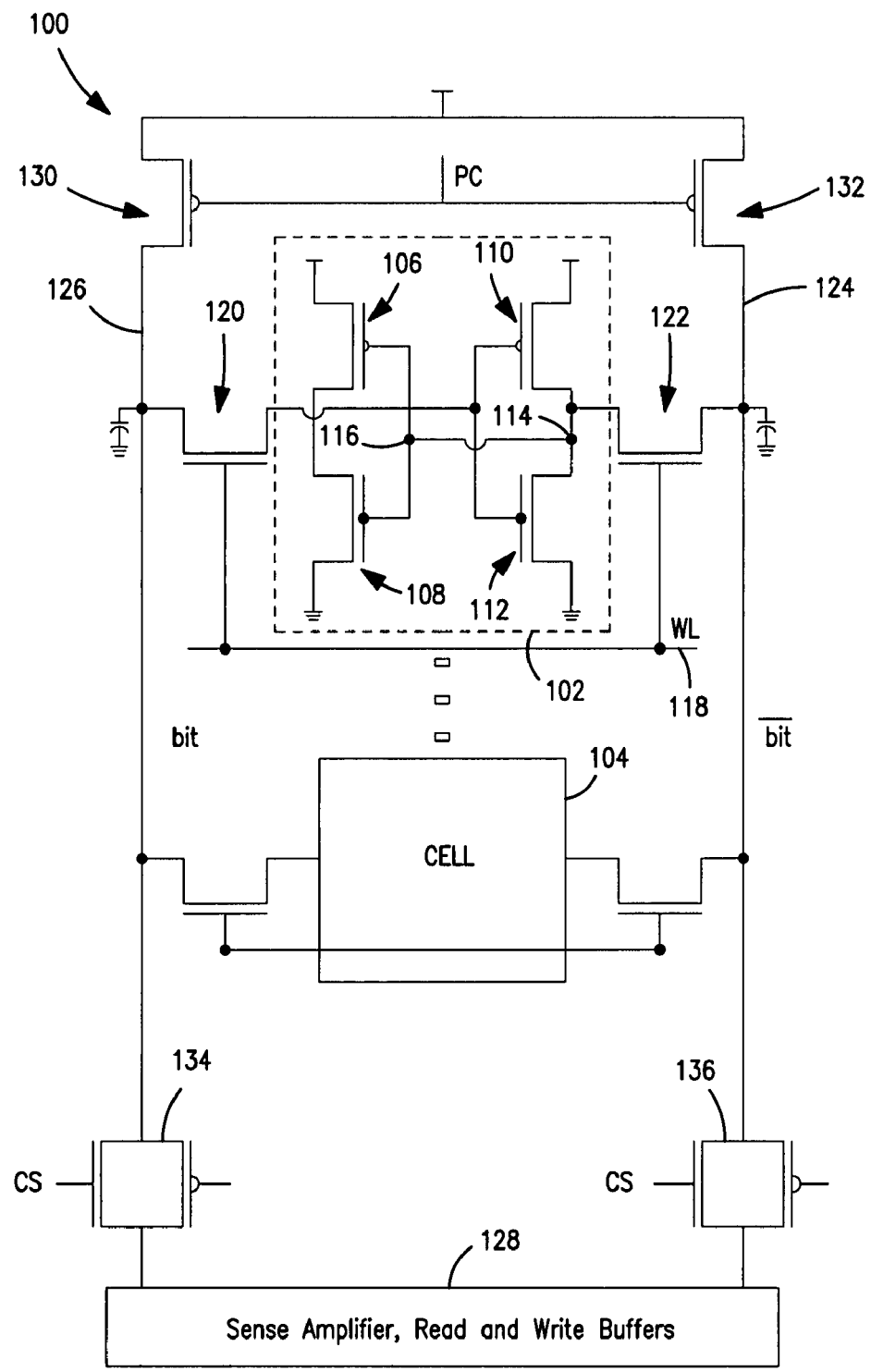
FIG. 1 is a circuit diagram of a conventional SRAM column.
Figure 2:
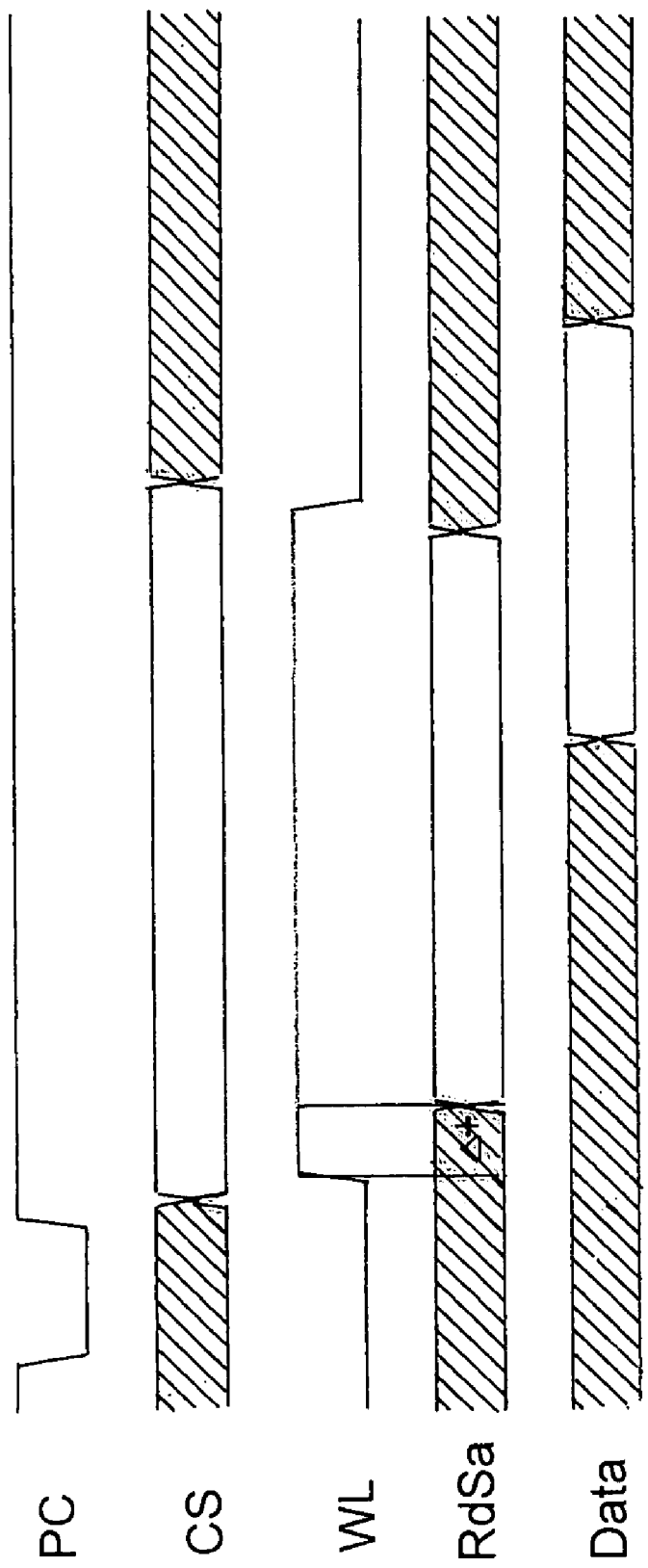
FIG. 2 is a waveform timing diagram for control signals applied to the SRAM column of FIG. 1 for a read operation.
Figure 3:
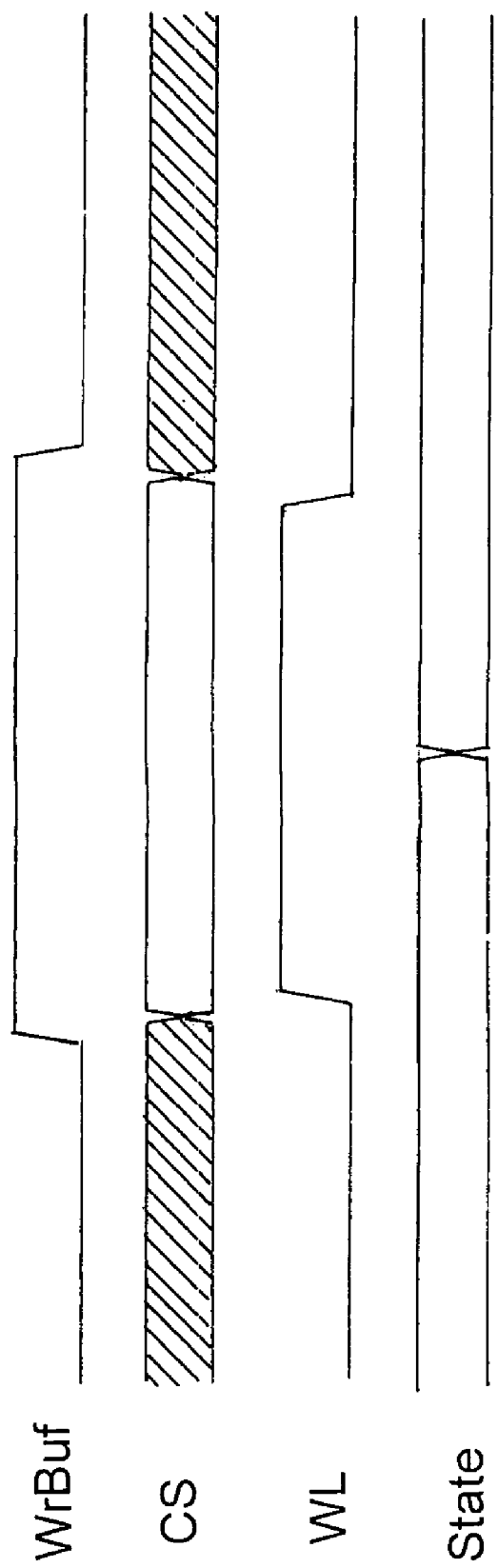
FIG. 3 is a waveform timing diagram for control signals applied to the SRAM column of FIG. 1 for a write operation.
Figure 4:
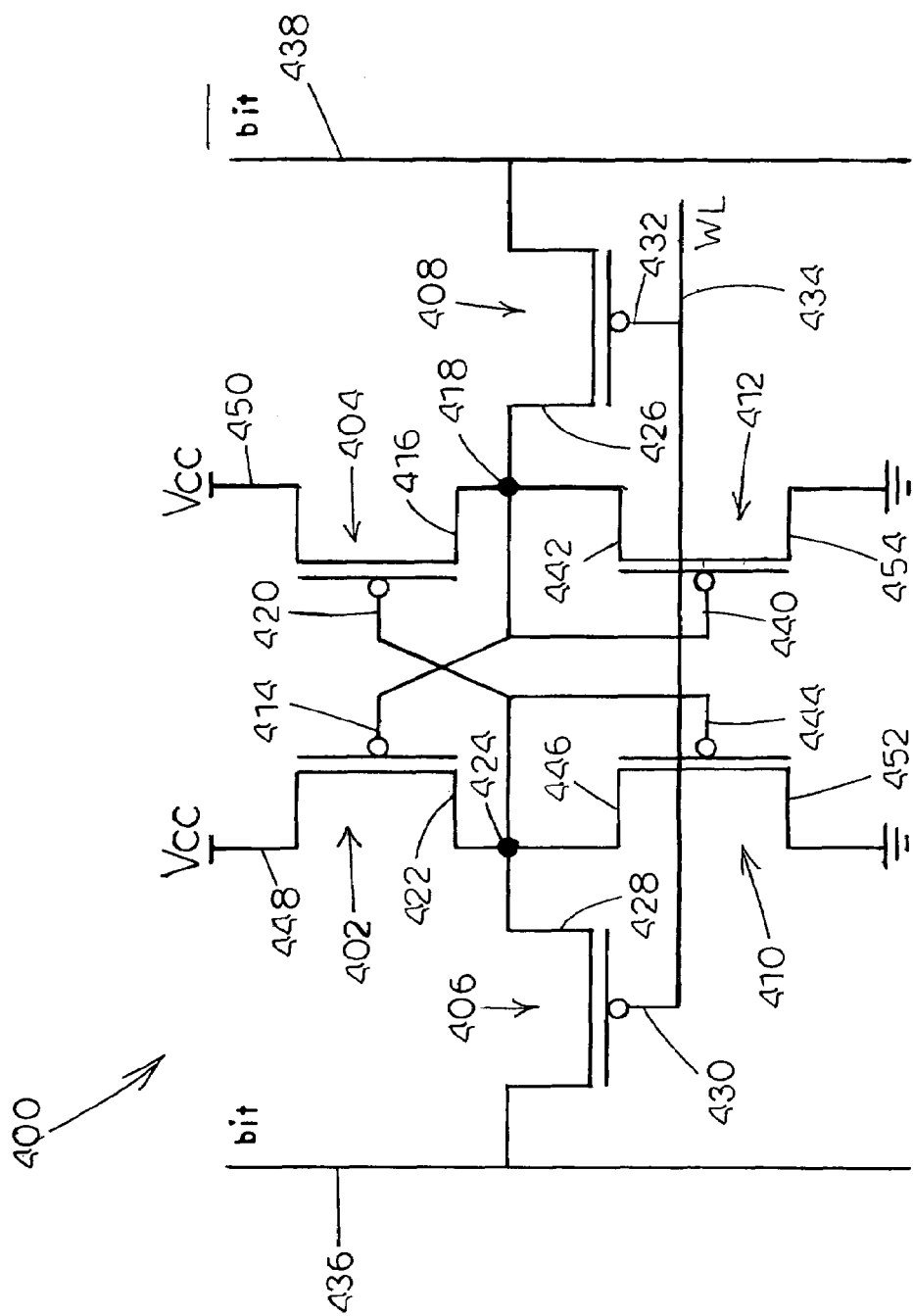
FIG. 4 is a circuit diagram of a p-channel enhancement-type metal-oxide semiconductor field-effect transistor (PMOSFET) static random-access memory (SRAM) cell according to the subject matter described herein.

FIG. 4 illustrates a circuit diagram of a PMOSFET SRAM cell 400 according to the subject matter described herein. SRAM cell 400 is a one-bit memory structure for storing one-bit of data. Referring to FIG. 4, SRAM cell 400 may include six PMOSFETs 402, 404, 406, 408, 410, and 412. As described in further detail herein, an SRAM cell, such as SRAM cell 400, can include all PMOSFETs and be utilized as the basic memory storage component in a memory cell array.

Transistors 402 and 404 can form a cross-coupled PMOSFET latch. A latch is a basic unit for retaining data. A gate 414 of transistor 402 can be connected to a drain 416 of transistor 404 at a memory node 418. Further, a gate 420 of transistor 404 can be connected to a drain 422 of transistor 402 at a memory node 424.

Transistors 406 and 408 can form an access circuit for reading and writing to the memory nodes. Memory nodes 418 and 424 are connected to sources 426 and 428 of transistors 408 and 406, respectively. Gates 430 and 432 of transistors 406 and 408, respectively, can be connected to a word line 434 to perform reading and writing with bit lines 436 and 438 via transistors 410 and 412. Gate 414 of transistor 402 and a gate 440 of transistor 412 are connected to node 418, which is connected to drain 416 of transistor 404 and a source 442 of transistor 412. Gate 420 of transistor 404 and a gate 444 of transistor 410 are connected to node 424, which is connected to drain 422 of transistor 402 and a source 446 of transistor 410. Sources 448 and 450 of transistors 402 and 404, respectively, are connected to a power supply $V_{cc}$. Drains 452 and 454 of transistors 410 and 412 are connected to ground. Bit lines 436 and 438 are connected to drains 456 and 458 of transistors 406 and 408, respectively.

In either a read or write operation for SRAM cell 400, bit lines 436 and 438 can be discharged such that the bit line voltages are approximately 0 volts (V). Next, the voltages of bits lines are allowed to float. Next, word line 434 can be enabled or its voltage raised for turning on transistors 406 and 408. As a result, memory nodes 418 and 424 are connected to bit lines 438 and 436, respectively, and data can be written to or read from the bit lines.

In an example of a read operation, the voltage signal that appears between bit lines 436 and 438 can be fed to a sense amplifier (not shown in FIG. 4). The sense amplifier can be active and its output connected to a data output line. For example, assuming that SRAM cell 400 is storing logic "0", transistor 410 is on and transistor 412 is off. When transistors 406 and 408 are turned on, current flows from bit line 436 through transistors 406 and 410 to ground. As a result, the voltage of bit line 436 is decreased. Simultaneously, current flows from power supply $V_{CC}$ through transistors 404 and 408 and onto bit line 438. As a result, the voltage of bit line 438 is increased. The voltage signal appearing between bit lines 436 and 438 is logic "0" and can then be fed to the sense amplifier.

Further, in another example of a read operation, SRAM cell 400 is storing logic "1". In this example, transistor 410 is off and transistor 412 is on. When transistors 406 and 408 are turned on, current flows from bit line 438 through transistors 408 and 412 to ground. As a result, the voltage of bit line 438 is decreased. Simultaneously, current flows from power supply $V^{cc}$ through transistors 402 and 406 and onto bit line 436. As a result, the voltage of bit line 436 is increased. The voltage signal appearing between bit lines 436 and 438 is and 438 is logic "1" and can be fed to the sense amplifier.

In an example of a write operation, the data to be written can be transferred to bit lines 436 and 438. If logic "0" is to be written, bit line 436 can be lowered to ground and bit line 438 is increased to voltage $V^{cc}$ for writing logic "0" to SRAM cell 400. Access transistors 406 and 408 can then cause the low voltage to appear at memory node 424 and the high voltage to appear at memory node 418. SRAM cell 400 is then forced into the state in which drain 422 of transistor 402 and source 446 of transistor 410 is low, and in which drain 416 of transistor 404 and source 442 of transistor 412 is high. This state, which denotes logic "0", can be maintained until changed by another write operation.

Further, in another example of a write operation, bit line 436 is increased to voltage $V_{CC}$ and bit line 438 is lowered to ground for writing logic "0" to SRAM cell 400. Access transistors 406 and 408 can then cause the high voltage to appear at memory node 424 and the low voltage to appear at memory node 418. SRAM cell 400 is then forced into the state in which drain 422 of transistor 402 and source 446 of transistor 410 is high, and in which drain 416 of transistor 404 and source 442 of transistor 412 is low. This state, which denotes logic "1", can be maintained until changed by another write operation.

SRAM cell 400 can be stable when in logic "1" state (i.e., when memory node 424 is at logic "1" and memory node 418 is at logic "0") and logic "0" state (i.e., when memory node 424 is at logic "1" and memory node 418 is at logic "0"). For example, in logic "1" state, the gate-to-source voltage $|V_{GS}|$ for transistor 402 is approximately $V_{CC}$ if logic "0" is close to 0 V. Transistor 402 is on and it is in a linear region of operation because the drain-to-source voltage $|V_{DS}|$ is small and the gate-to-source voltage $|V_{GS}|$ is approximately $V^{cc}$. The current balance at memory node 424 determines the voltage at the node. The currents leaving memory node 424 are the source currents of transistors 406 and 410 and the gate current of transistor 404. The voltage on memory node 424 reaches a value that balances the output and input currents. The application of Kirchoff's application of Kirchoffs Current Law to memory node 424 provides the following equation:

$$I_D(\text{trans. } 402) - I_S(\text{trans. } 406) - I_S(\text{trans. } 410) - I_G(\text{trans. } 410) = 0$$

Transistor 402 is on while transistors 406 and 410 are in cut off. As a result, the drain-to-source $|V^{DS}|$ required across transistor 402 to supply the source current $(I^S)$ of transistor 406, the source current $(I_S)$ of transistor 410, and the drain current $(I^G)$ of transistor 410 is small.

The gate-to-source voltage $|V_{GS}|$ of transistor 404 is approximately zero if logic "1" is close to $V_{CC}$. In this case, transistor 404 is cut off. Memory node 418 is isolated from the power supply as the pull-up transistor 404 is cut off. The current balance at node 418 can determine the voltage at the node. The application of Kirchoff's Current Law to memory node 418 provides the following equation:

$$I_D(\text{trans. } 404) - I_S(\text{trans. } 408) - I_S(\text{trans. } 412) - I_G(\text{trans. } 422) = 0$$

The drain current $(I_D)$ of transistor 404 is due to gate-to-drain overlap tunneling current in the transistor. Similarly, the source current $(I_S)$ of transistor 408 is due to gate-to-source overlap tunneling current in the transistor. The source current $(I_S)$ in transistor 412 is due to subthreshold conduction in the transistor. The gate current $(I_G)$ in transistor 412 is due to gate-to-source overlap tunneling current in the transistor. The actual voltage that node 418 reaches may depend on the relative magnitudes of the currents at the node.

Figure 5:
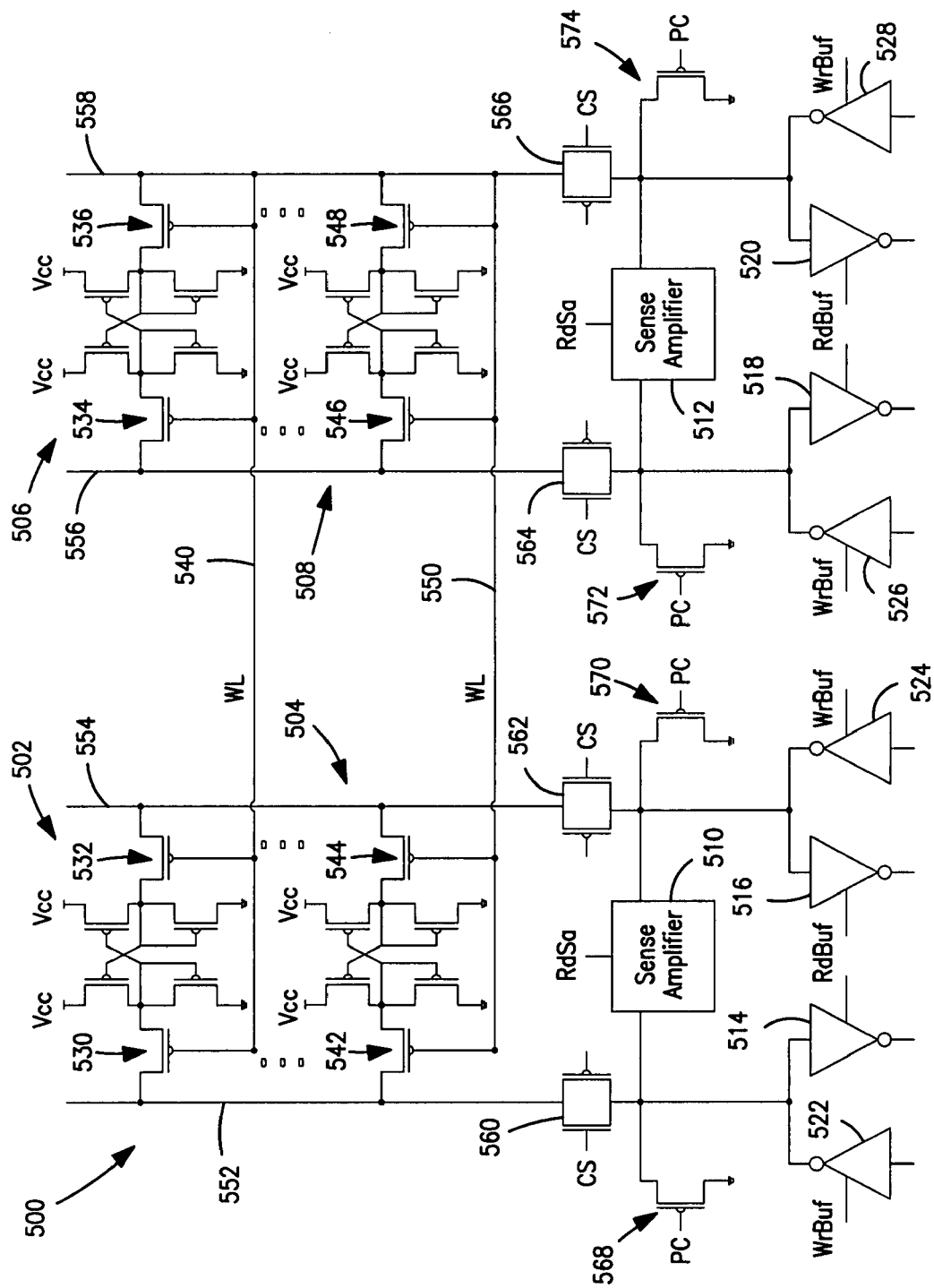
FIG. 5 is a circuit diagram of a memory cell array including a plurality of PMOSFET SRAM cells.

A PMOSFET SRAM cell, as described with respect to FIG. 4, can be implemented in a memory cell array. The SRAM cells in the array can be accessed by word lines. Further, the SRAM cells can be connected to bit lines for read and write operations. FIG. 5 illustrates a circuit diagram of a memory cell array including a plurality of PMOSFET SRAM cells. Referring to FIG. 5, a memory cell array 500 includes an array of PMOSFET SRAM cells (502, 504, 506, and 508), sense amplifiers (510 and 512), read buffers (514, 516, 518, and 520), and write buffers (522, 524, 526, and 528). SRAM cells 502 and 506 can include access PMOSFETs (530, 532, 534, and 536) which are connected together at their gates to a word line 540. Further, SRAM cells 504 and 508 can include access PMOSFETs (542, 544, 546, and 548) which are connected together at their gates to a word line 550. SRAM cells 502 and 504 can be connected in a memory column via a pair of bit lines 552 and 554. Further, SRAM cells 506 and 508 can be connected in a memory column via a pair of bit lines 556 and 558. Bit line 552 can be connected to a column select pass gate 560, sense amplifier 510, write buffer 522, and read buffer 514. Further, bit line 554 can be connected to a column select pass gate 562, sense amplifier 510, write buffer 524, and read buffer 514. Bit line 556 can be connected to a column select pass gate 564, sense amplifier 512, write buffer 526, and read buffer 518. Further, bit line 558 can be connected to a column select pass gate 566, sense amplifier 512, write buffer 528, and read buffer 520.

Figure 6:
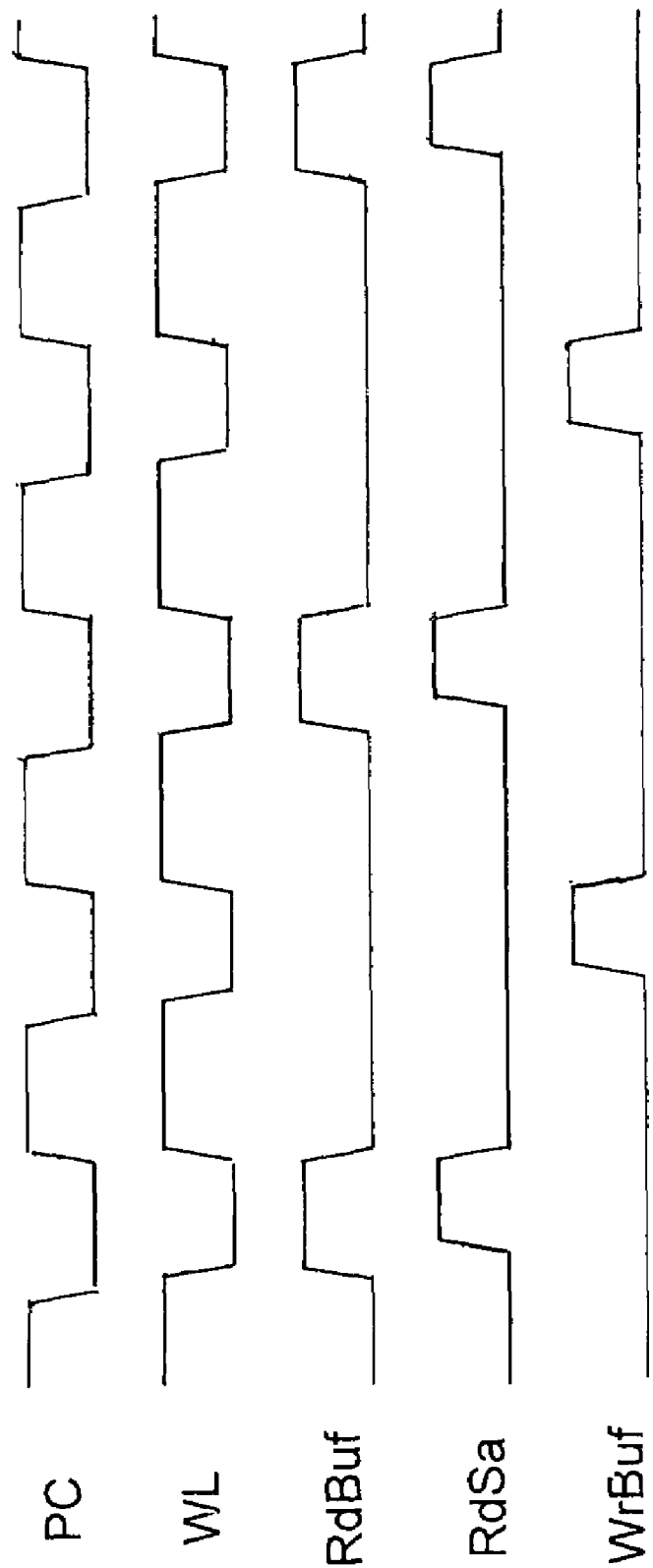
FIG. 6 is a waveform timing diagram for control signals applied to the cell array shown in FIG. 5.

FIG. 6 illustrates a waveform timing diagram for control signals applied to cell array 500 shown in FIG. 5. Referring to FIG. 6, a precharge (PC) signal is applied to bit lines 552, 554, 556, and 558 for discharging the bit lines to approximately 0 V. Referring to FIG. 5, cell array 500 can include precharge transistors 568, 570, 572, and 574 for connecting bits lines 552, 554, 556, and 558, respectively, to ground on application of the PC signal. The signals transmitted to precharge transistors 568, 570, 572, and 574 can be active-high. Prior to a read or write operation, the PC signal is disabled in order to allow the bit lines to float. Next, immediately after the PC signal is disabled, a word line (WL) signal is enabled for connecting a selected cell to the bit lines. For example, referring to FIG. 5, a WL signal can be applied to word line 540 for selecting either SRAM cell 502 or 504. The signals transmitted on word lines 540 and 550 can be active-low. Next, either a read or write operation can be performed.

During a read operation, the read buffers can be enabled by application of a RdBuf signal. For example, referring to FIG. 5, a RdBuf signal can be applied to read buffers 514, 516, 518, and 520. After a predetermined time period, a RdSa signal can be applied for turning sense amplifiers on. For example, referring to FIG. 5, a RdSa signal can be applied to sense amplifiers 510 and 512. The RdSa signal can be enabled after the differential signal between the bit lines reaches $0.05V_{cc}$. The predetermined time period between enabling the RdBuf signal and the RdSa signal can be long enough to ensure that a great enough differential voltage is present between the bit lines. After activating the RdSa channel, the bit lines can be driven to their appropriate data value by the sense amplifiers for read by suitable circuitry. The read operation can be concluded by disabling the RdSa channel, the RdBuf channel, and the WL channel. Referring to FIG. 6, a read operation occurs at the times when the RdBuf and RdSa signals are high.

During a write operation, the write buffers can be enabled by application of a WrBuf signal. For example, referring to FIG. 5, a WrBuf signal can be applied to write buffers 522, 524, 526, and 528. Next, the bit lines are forced to the values to be written by applying the appropriate logic to the inputs of the write buffers. For example, in order to write logic "0" to SRAM cell 502, 0 V is applied to bit line 552, and voltage $V_{DD}$ is applied to bit line 554. Further, for example, logic "1" can be written to SRAM cell 502 by applying voltage $V_{DD}$ to bit line 552, and applying 0 V to bit line 554. The values can be written to SRAM cell 502 because transistors 530 and 532 are turned on. The write operation can be concluded by disabling the WrBuf channel and the WL channel. Referring to FIG. 6, a write operation occurs at the times when the WrBuf signal is high.

Figure 7A:
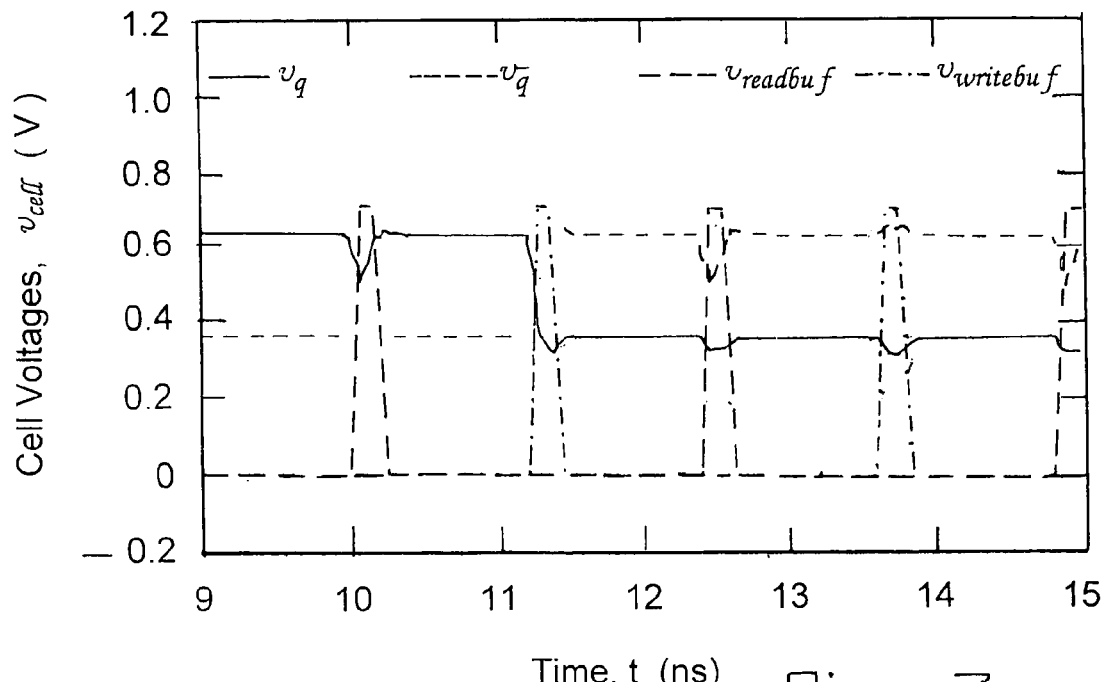
FIG. 7A is a timing diagram of test results of a read-write-read-write operation on a PMOSFET SRAM cell array having a 35 nm node according to the subject matter described herein.
Figure 7B:
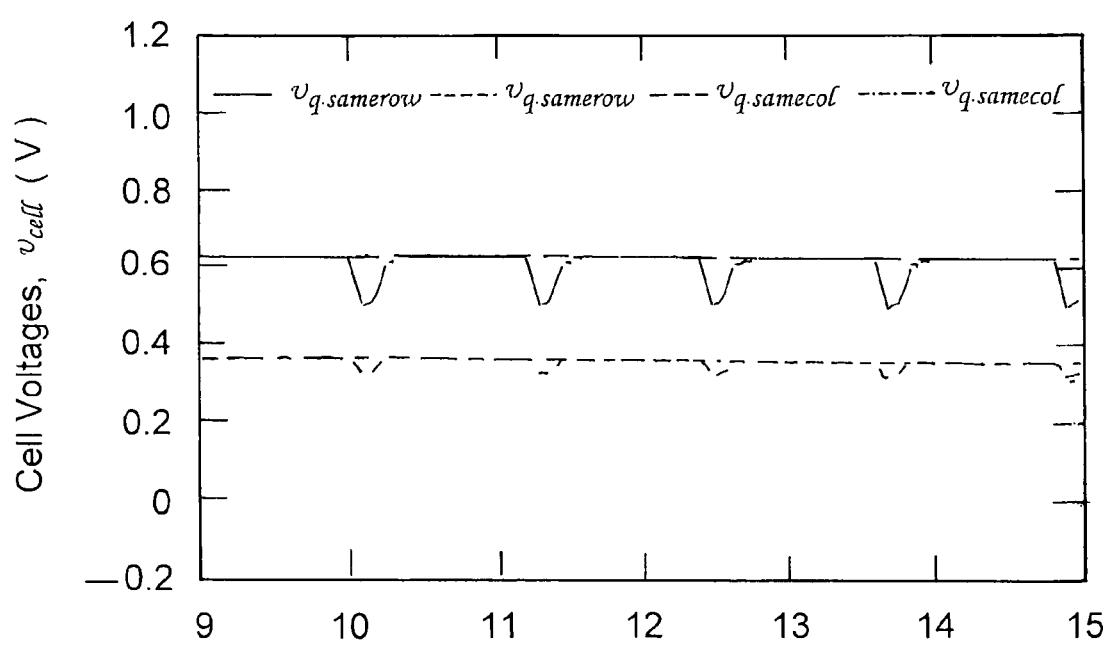
FIG. 7B is another timing diagram of test results of a read-write-read-write operation on a PMOSFET SRAM cell array having a 35 nm node according to the subject matter described herein.

FIGS. 7A and 7B illustrate timing diagrams of test results of a read-write-read-write operation on a PMOSFET SRAM cell array having a 35 nm node according to the subject matter described herein. The memory size of the tested SRAM cell array is 64 bits, 32 rows and 2 columns. The internal voltages of the selected cell are shown in FIG. 7A. The cell internal voltages degrade when the access transistors are turned on for a read operation. The cell internal cell internal voltages start to improve only after the sense amplifier is activated. In the first write cycle, the data in the latch is reset demonstrating writability. FIG. 7B shows the cell internal voltages for unselected cells that share the same row or column as the selected cell. The cells in the same column are unaffected as the access transistors for these cells are turned off. The cells in the same row as the selected cell show degraded internal voltages. The degradation of internal voltages in unselected cells in the same row occurs because it is an unintended read for the unselected cells. The sense amplifier for the unselected cells are never activated and hence the internal voltages of unselected cells sharing the same row as the selected cell degrade.

FIGS. 8A and 8B illustrate timing diagrams of test results of a read-write-read-write operation on a PMOSFET SRAM cell array having a 45 nm node according to the subject matter described herein. The internal voltages of the selected cell are shown in FIG. 8A. FIG. 8B shows the cell internal voltages for unselected cells that share the same row or column as the selected cell.

Figure 9A:
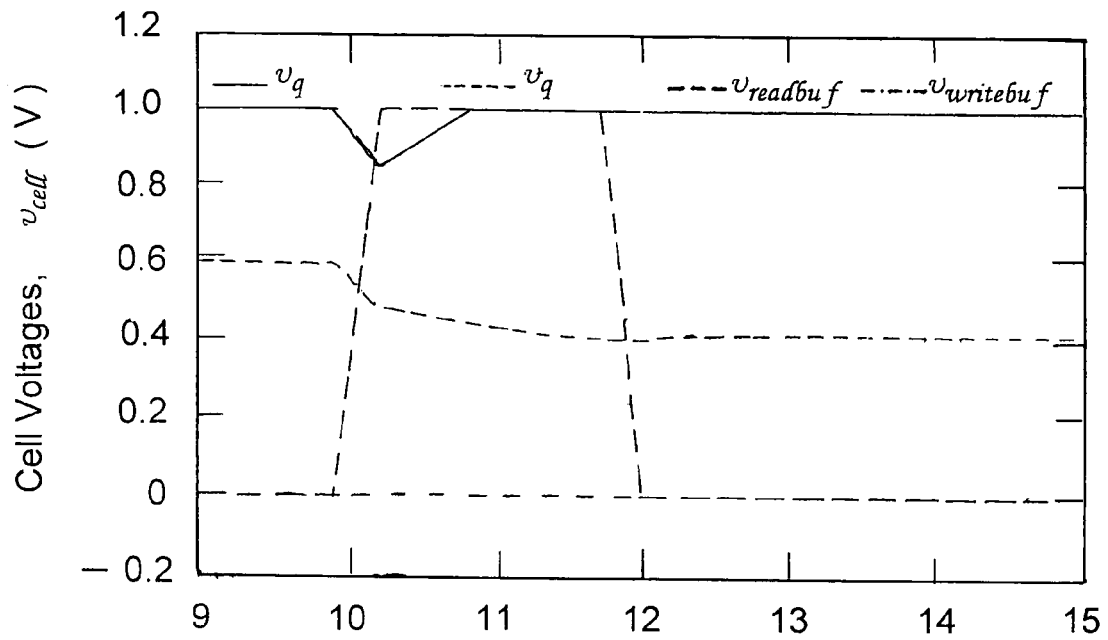
FIG. 9A is a timing diagram of test results of a read-write-read-write operation on a PMOSFET SRAM cell array having a 65 nm node according to the subject matter described herein.
Figure 9B:
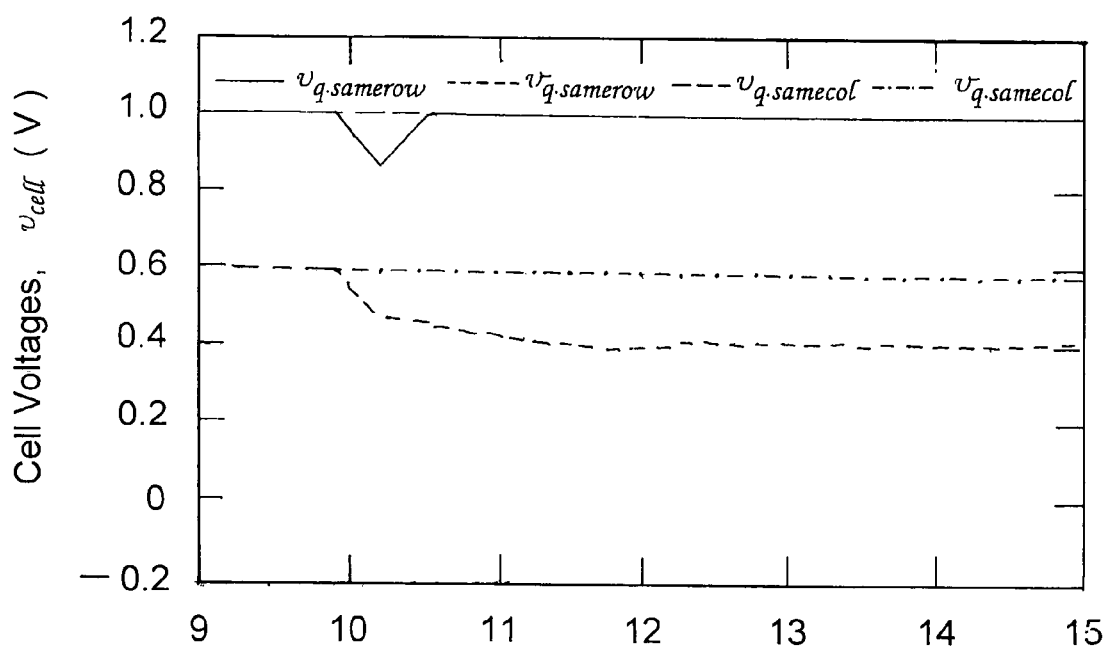
FIG. 9B is a timing diagram of test results of a read-write-read-write operation on a PMOSFET SRAM cell array having a 65 nm node according to the subject matter described herein.

FIGS. 9A and 9B illustrate timing diagrams of test results of a read-write-read-write operation on a PMOSFET SRAM cell array having a 65 nm node according to the subject matter described herein. The internal voltages of the selected cell are shown in FIG. 9A. FIG. 9B shows the cell internal voltages for unselected cells that share the same row or column as the selected cell.

SRAM cell design characteristics can include static power consumption, noise margin during read access, noise margin in the idle state when the SRAM cell is not accessed, and read delay time (i.e., the time required for the SRAM cell to generate a certain differential voltage between its bit lines). Experiments with SRAM cells having 65 nm, 45 nm, and 35 nm nodes were conducted to show the effects of varying design parameters on different design requirements. The varied design parameters included transistor sizes and pull-down transistor threshold voltage. The different design requirements included static power consumption, noise margin during read access, noise margin in the idle state, and read delay.

FIGS. 10A-10H illustrate graphs of tradeoff curves for an SRAM cell having a 35 nm node. The threshold voltage of the pull-down transistors is plotted along the x-axis. The experiments were carried out for eight sets of values of transistor sizes. FIGS. 10A, 10C, 10E, and 10G show the values for different characteristics for two values of the pull-up PMOSFET width $W_{pu}$, namely 2.5 $L_{min}$ and 5 $L_{min}$. For each of these values of $W_{pu}$, the access transistor lengths were varied between $L_{min}$ and 2.5 $L_{min}$. The width of the pull-down PMOSFET $W_{pd}$ was 2.5 $L_{min}$. The independent variable is the threshold voltage of the pull-down PMOSFETs.

FIGS. 10B, 10D, 10F, and 10H show the values for different characteristics for two values of the pull-up PMOSFET width $W_{pu}$, namely 2.5 $L_{min}$ and 5 $L_{min}$. For each of these values of $W_{pu}$, the access transistor lengths were varied between $L_{min}$ and 2.5 $L_{min}$. The width of the pull-down PMOSFET $W_{pd}$ was 5.0 $L_{min}$. The independent variable is the threshold voltage of the pull-down PMOSFETs.

Figure 10A:
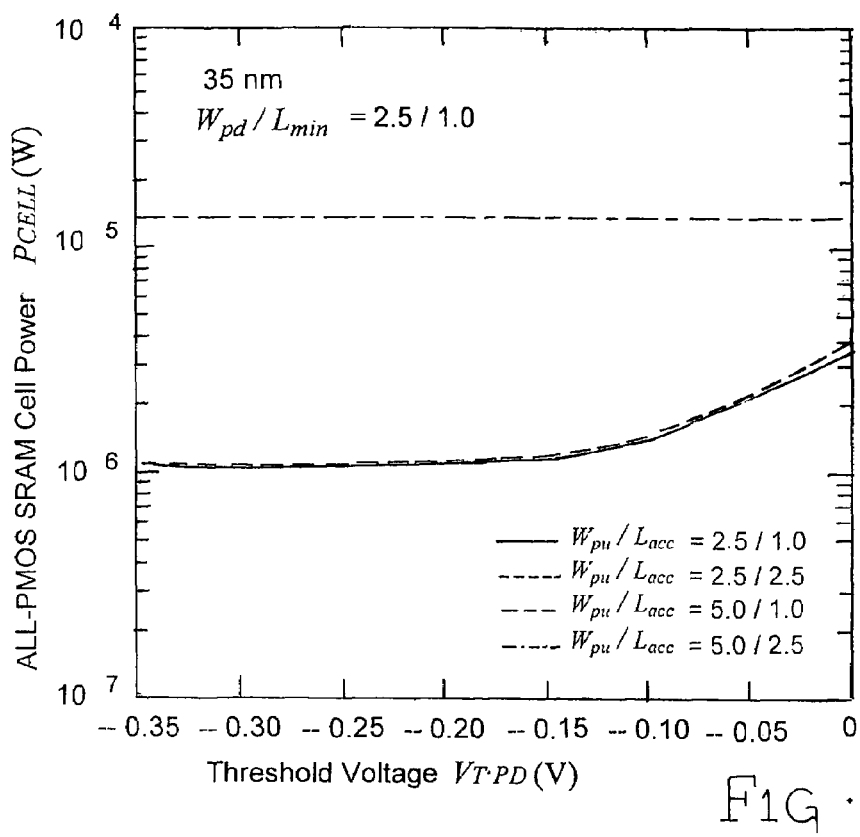
FIG. 10A is a graph of PMOSFET SRAM cell power versus threshold voltage for a 35 nm node according to the subject matter described herein.
Figure 10B:
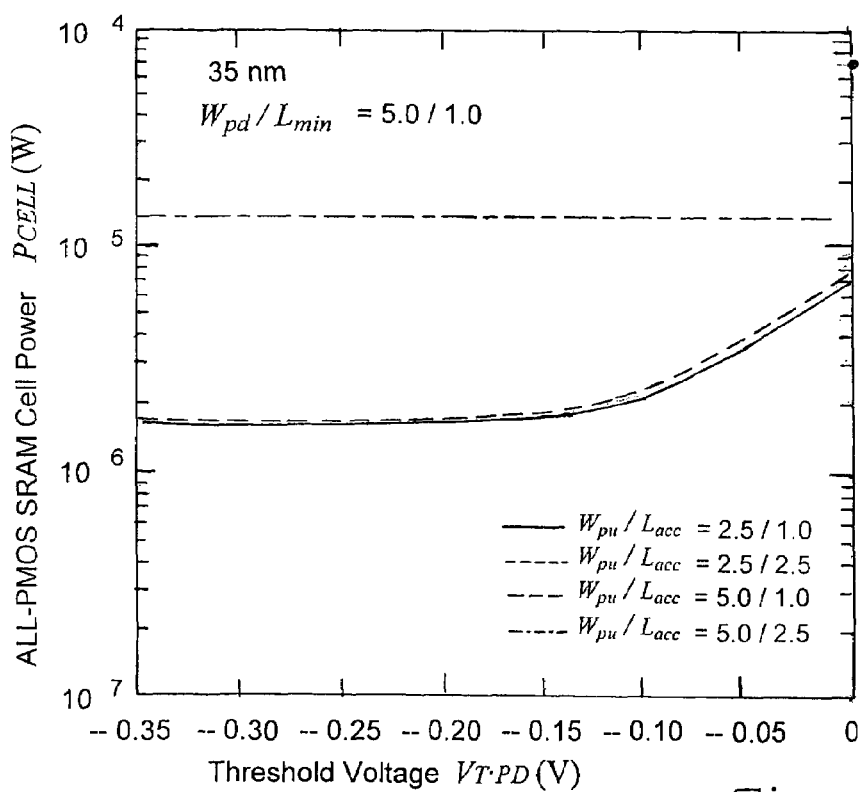
FIG. 10B is another graph of PMOSFET SRAM cell power versus threshold voltage for a 35 nm node according to the subject matter described herein.

Static power consumption of the SRAM cell is shown in FIGS. 10A and 10B. For large values of threshold voltage (e.g., $|V_T|>0.15$ V) of the pull-down PMOSFET, the static-power consumption is constant. The static power in an SRAM cell according the subject matter described herein may be primarily due to tunneling and subthreshold currents in a pull-down transistor (such as transistor 410 shown in FIG. 4). If the threshold voltage of the pull-down transistor is large, the tunneling current in the gate-to-source overlap tunneling current region may dominate. The gate-to-source overlap tunneling current may be independent of the threshold voltage of the pull-down transistor and hence the static power in the SRAM cell may be constant. When the threshold voltage of the pull-down transistor is reduced considerably, the pull-down transistor may no longer be in the cut-off range, but in the weak-inversion range. As a result, both the subthreshold current and the tunneling current through the channel increase, resulting in increased static-power consumption. FIG. 10B shows the impact of doubling the size of the pull-down transistors (such as transistors 410 and 412 shown in FIG. 4).

Figure 10C:
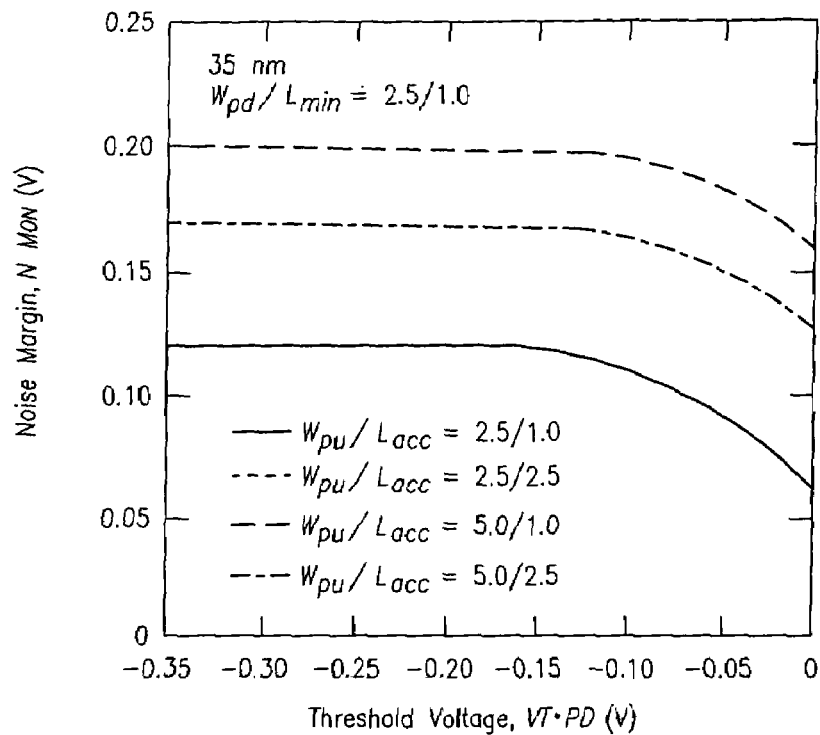
FIG. 10C is a graph of noise margin versus threshold voltage for a 35 nm node and access transistors on according to the subject matter described herein.
Figure 10D:
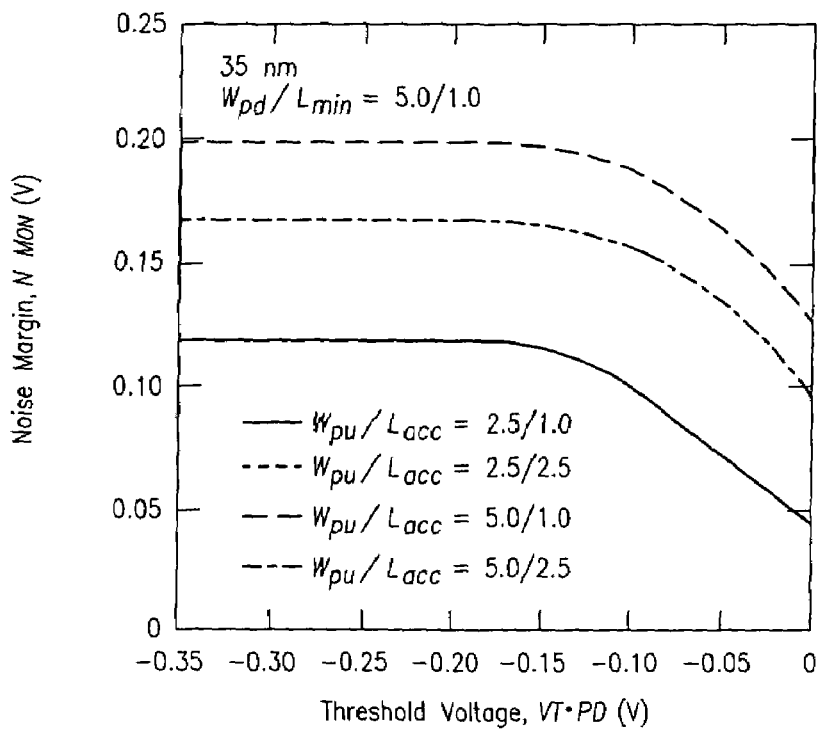
FIG. 10D is another graph of noise margin versus threshold voltage for a 35 nm node and access transistors on according to the subject matter described herein.

FIGS. 10C and 10D show noise margins when the access transistors are on. The noise margin can be degraded by reducing the threshold of the pull-down devices beyond $-0.2$ V. As the threshold voltage $V_T$ of the pull-down PMOSFETs is reduced, the tunneling and subthreshold currents can increase. Effectively, the total load on the pull-up PMOSFETs increases. The logic "1" voltage begins to degrade, which degrades the noise margin. Noise margin can be improved by having larger $W_{pu}$, because the larger pull-up PMOSFETs have larger drive currents improving the logic "1" voltage.

Figure 10E:
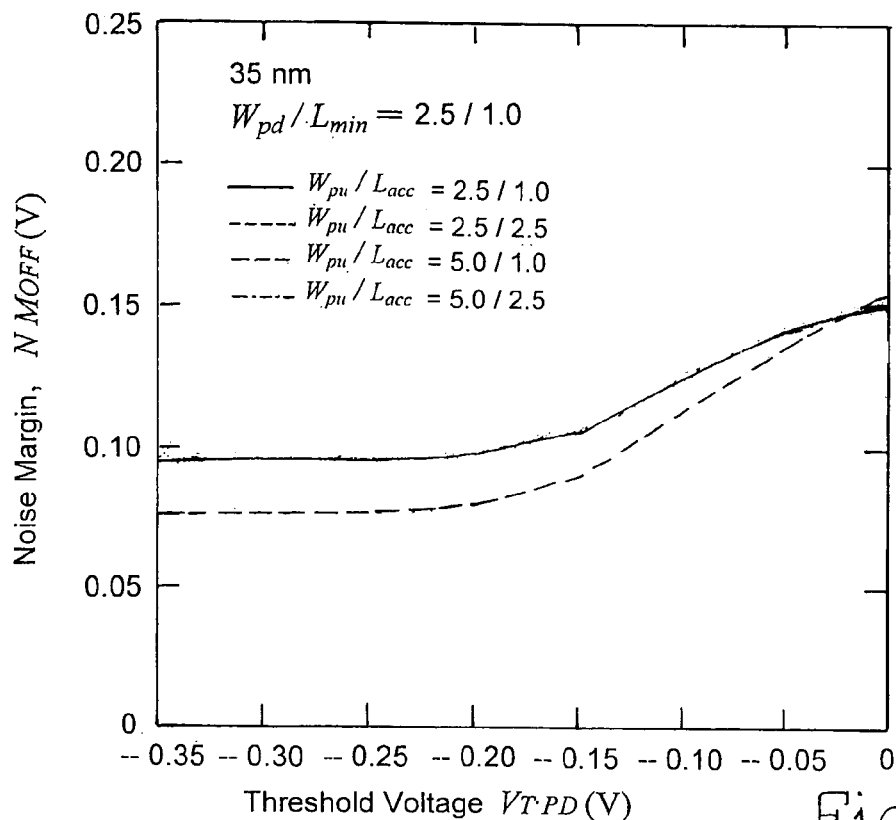
FIG. 10E is a graph of noise margin versus threshold voltage for a 35 nm node and access transistors off according to the subject matter described herein.
Figure 10F:
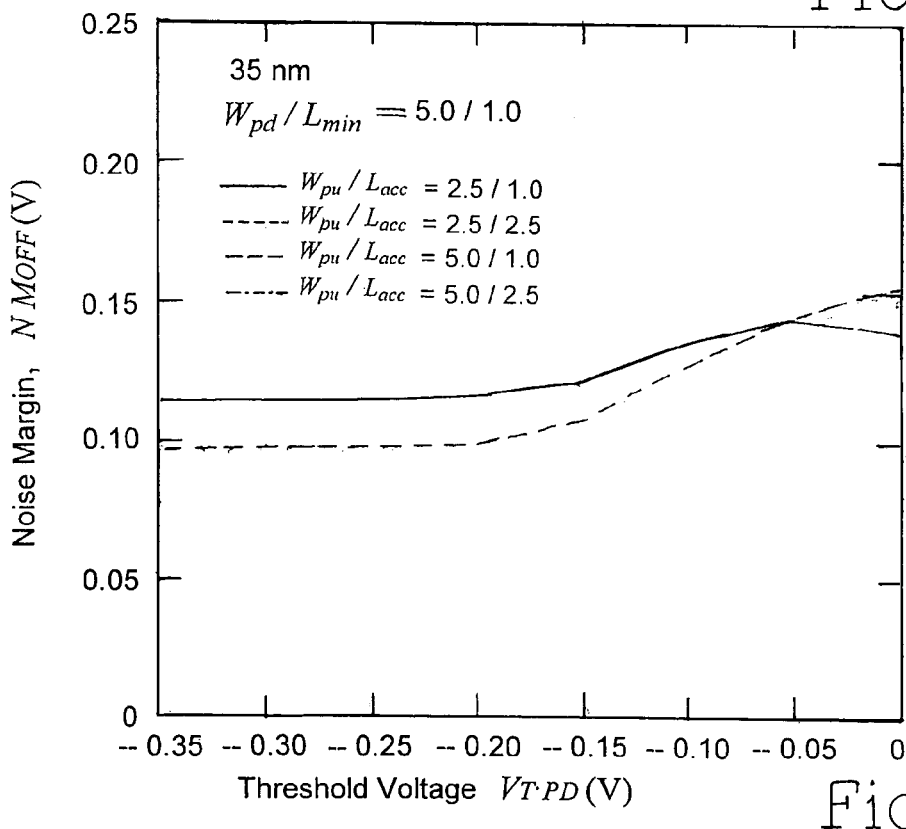
FIG. 10F is another graph of noise margin versus threshold voltage for a 35 nm node and access transistors off according to the subject matter described herein.

FIGS. 10E and 10F show the noise margins when the access transistors are off. The off noise margin can be improved by reducing the threshold of the pull-down devices. As the threshold voltage $V_T$ of the pull-down PMOSFETs is reduced, the magnitude of the logic "0" voltage becomes smaller. The improved logic "0" voltage can improve the drive of the pull-up transistor (such as transistor 402 shown in FIG. 4) increasing the logic "1" voltage. The net effect is an improvement in the overall signal swing as both the logic "0" and logic "1" voltages improve, which results in improved noise margin. The load on the pull-up transistor can also be increased by reducing the threshold voltage of the pull-down PMOSFETs and improving the drive for the pull-up PMOSFET. For example, reducing the threshold voltage of the pull-down PMOSFET (such as transistor 412 shown in FIG. 4) can result in a lower logic "0" voltage. The lower logic "0" voltage on its associated memory node (such as memory node 418 shown in FIG. 4) can improve the drive for a pull-up transistor (such as transistor 402 shown in FIG. 4), which leads to improved logic "1" voltage at its associated memory node (such as memory node 424 shown in FIG. 4). Noise margins between 60 and 155 mV can be provided with SRAM cells having $W_{pd}=2.5\ L_{min}$ and $W_{pu}=2.5\ L_{min}$.

Figure 10G:
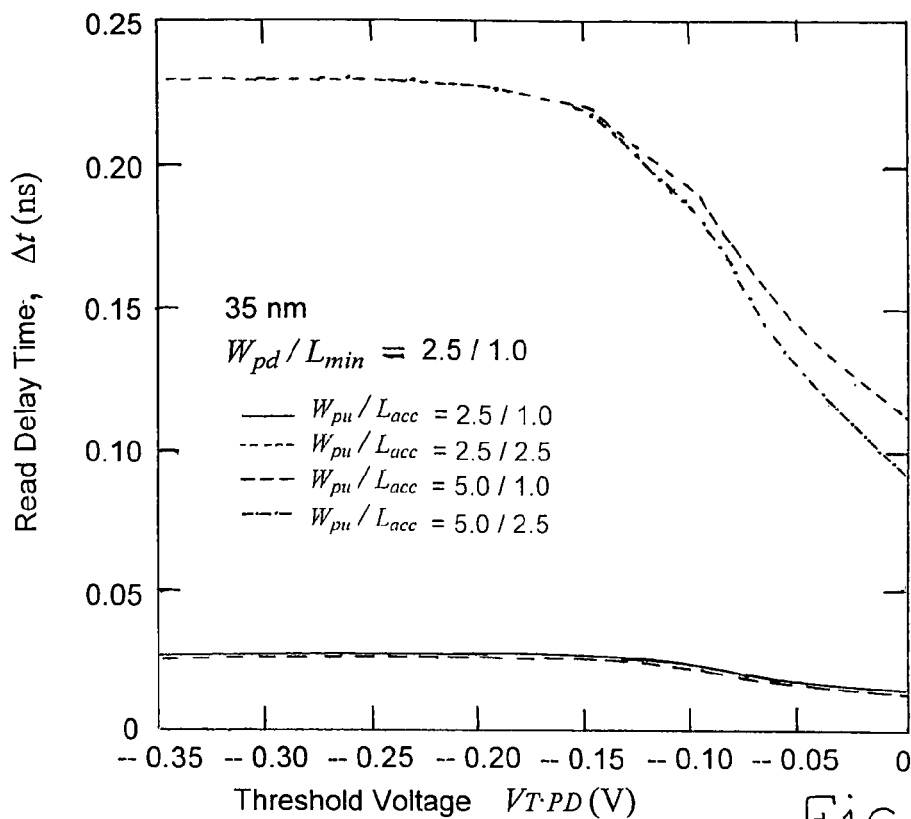
FIG. 10G is a graph of read delay time versus threshold voltage for a 35 nm node according to the subject matter described herein.
Figure 10H:
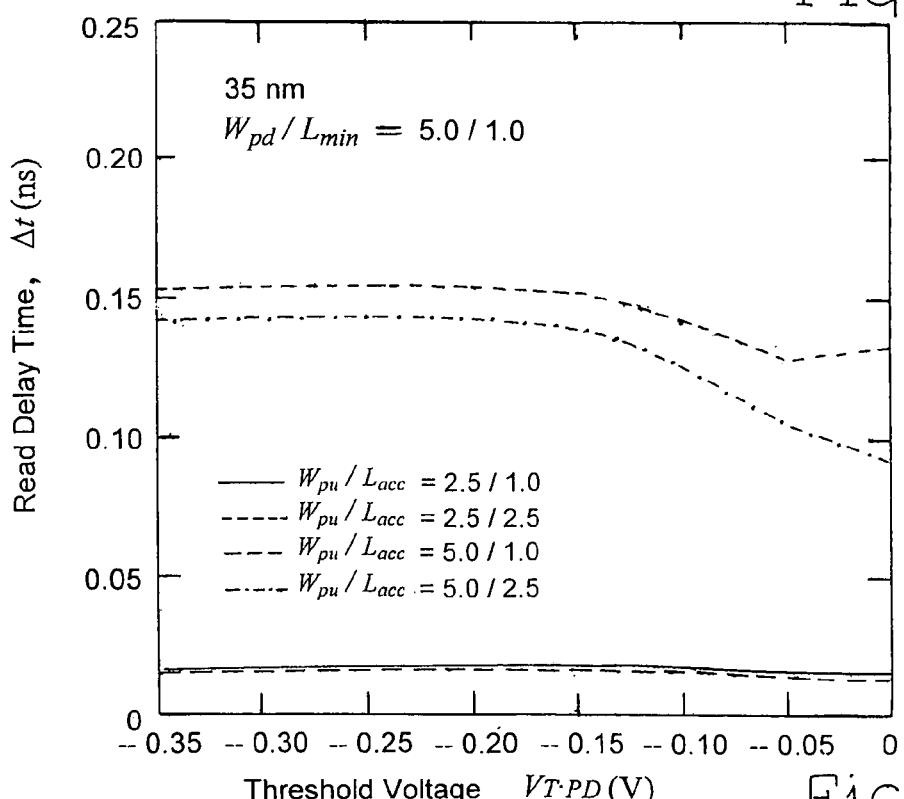
FIG. 10H is another graph of read delay time versus threshold voltage for a 35 nm node according to the subject matter described herein.
Figure 11A:
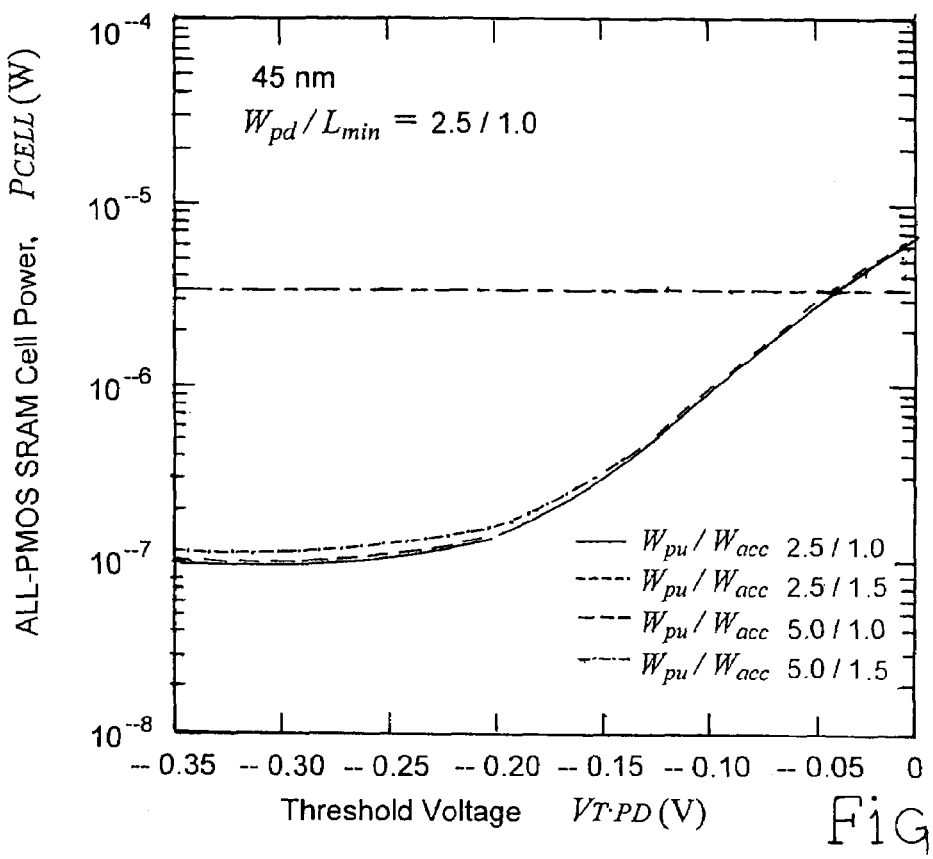
FIG. 11A is a graph of PMOSFET SRAM cell power versus threshold voltage for a 45 nm node according to the subject matter described herein.
Figure 11B:
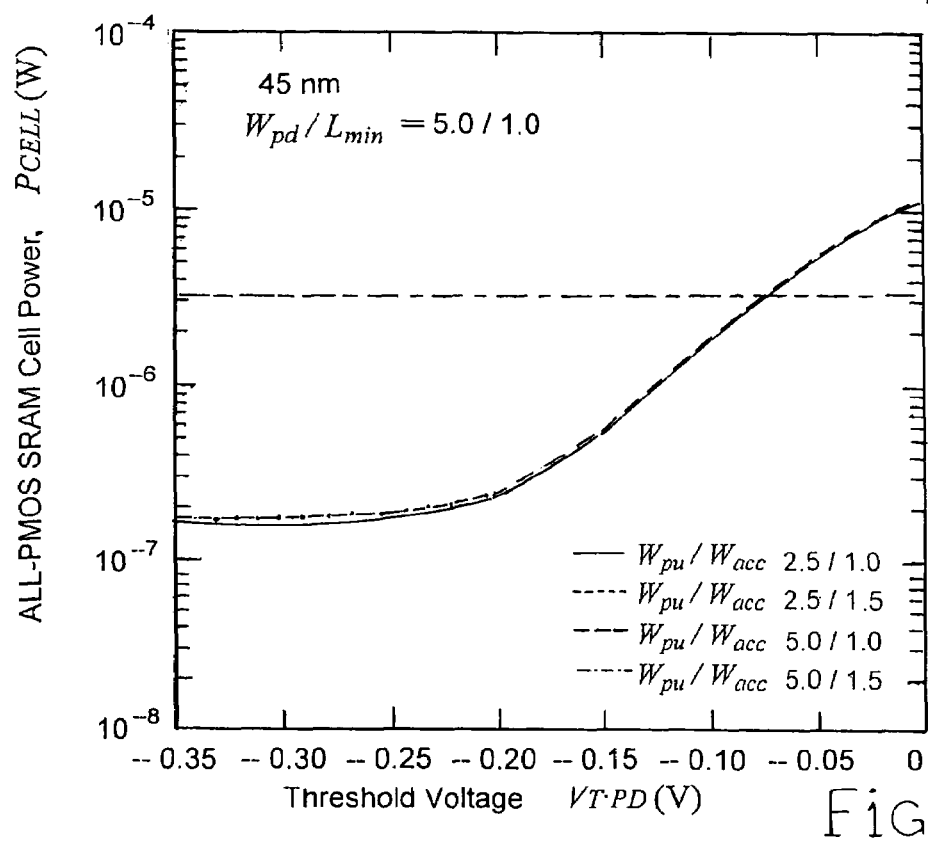
FIG. 11B is another graph of PMOSFET SRAM cell power versus threshold voltage for a 45 nm node according to the subject matter described herein.
Figure 11C:
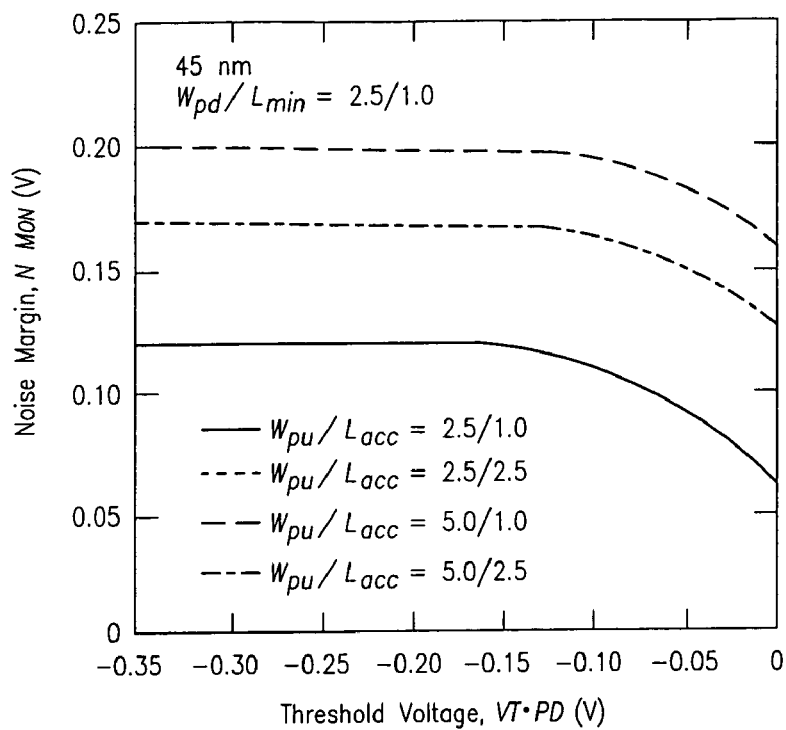
FIG. 11C is a graph of noise margin versus threshold voltage for a 45 nm node and access transistors on according to the subject matter described herein.
Figure 11D:
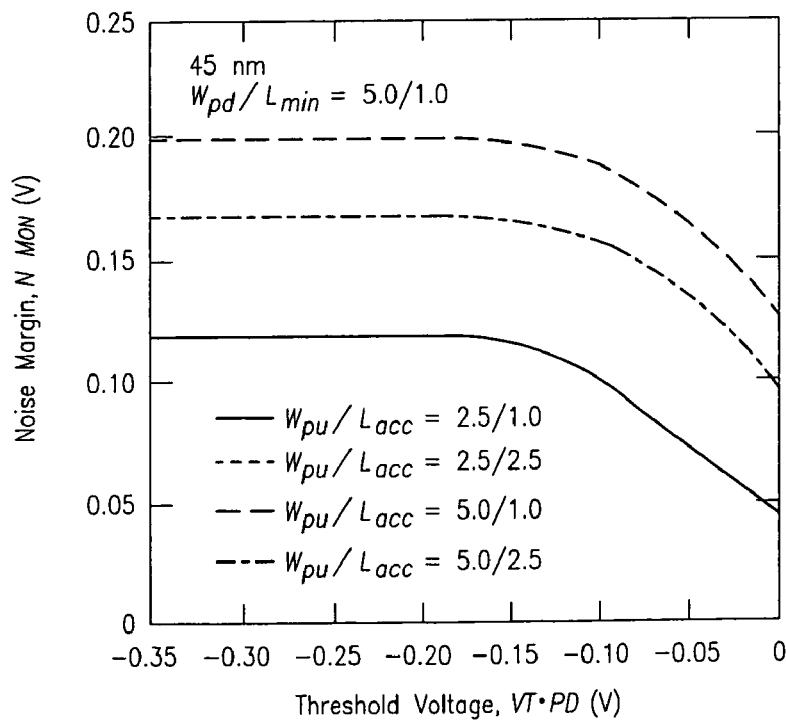
FIG. 11D is another graph of noise margin versus threshold voltage for a 45 nm node and access transistors on according to the subject matter described herein.
Figure 11E:
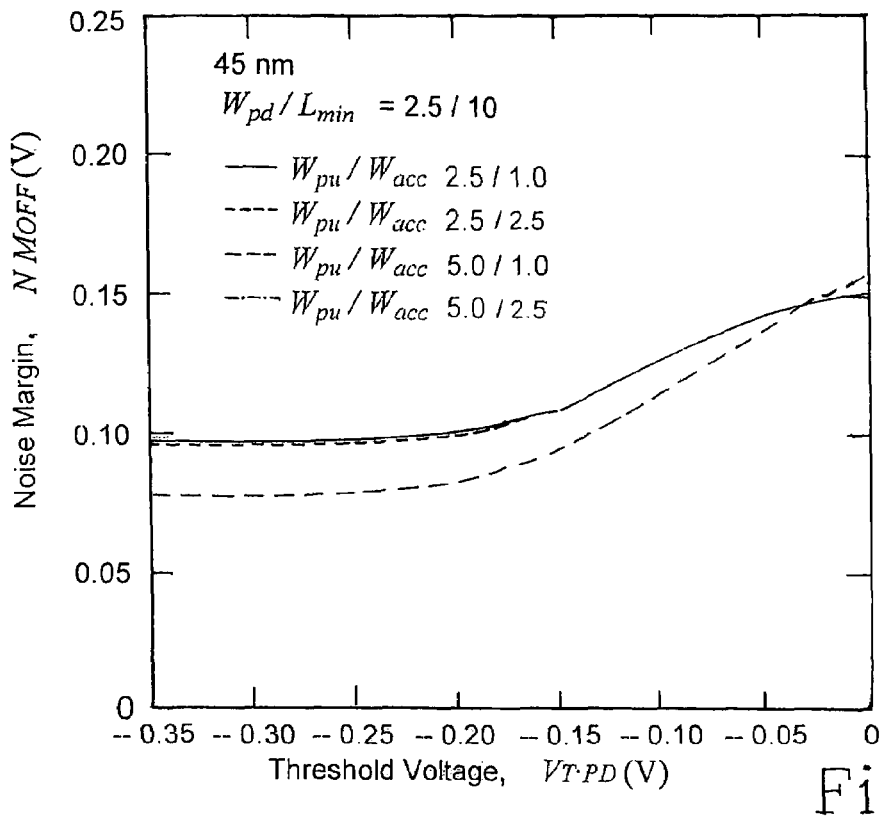
FIG. 11E is a graph of noise margin versus threshold voltage for a 45 nm node and access transistors off according to the subject matter described herein.
Figure 11F:
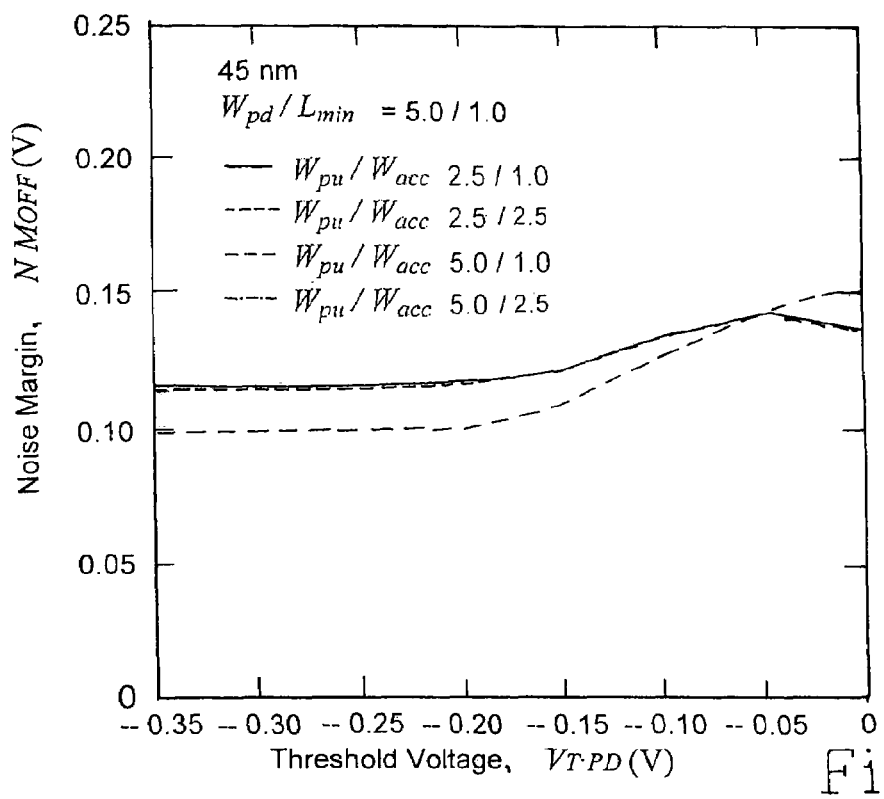
FIG. 11F is another graph of noise margin versus threshold voltage for a 45 nm node and access transistors off according to the subject matter described herein.
Figure 11G:
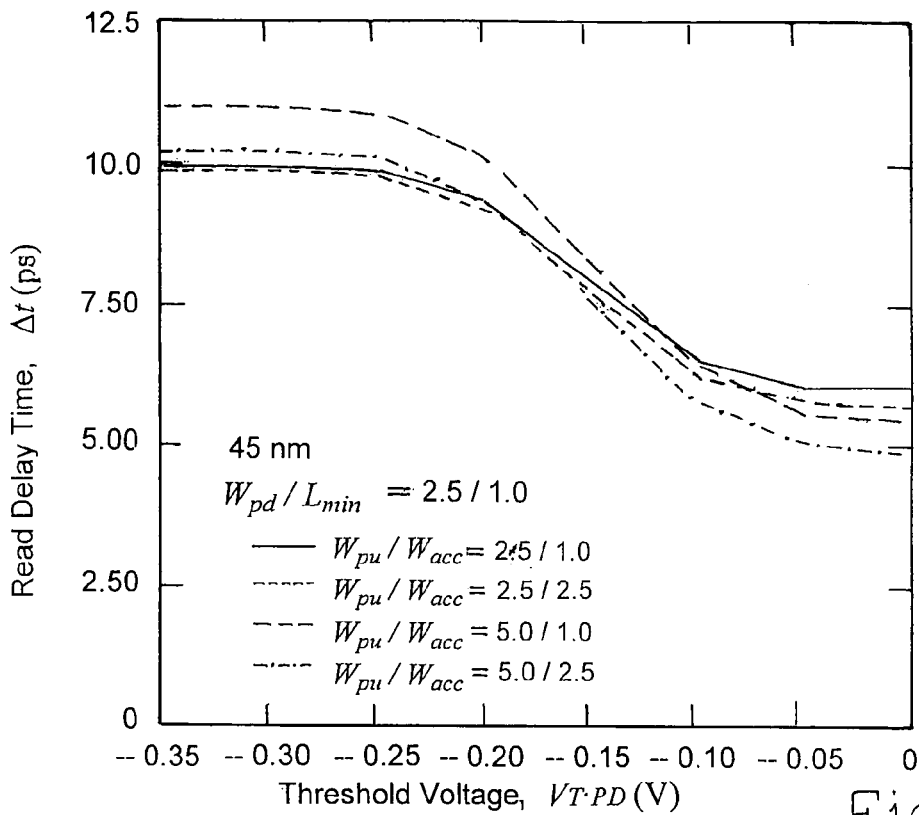
FIG. 11G is a graph of read delay time versus threshold voltage for a 45 nm node according to the subject matter described herein.
Figure 11H:
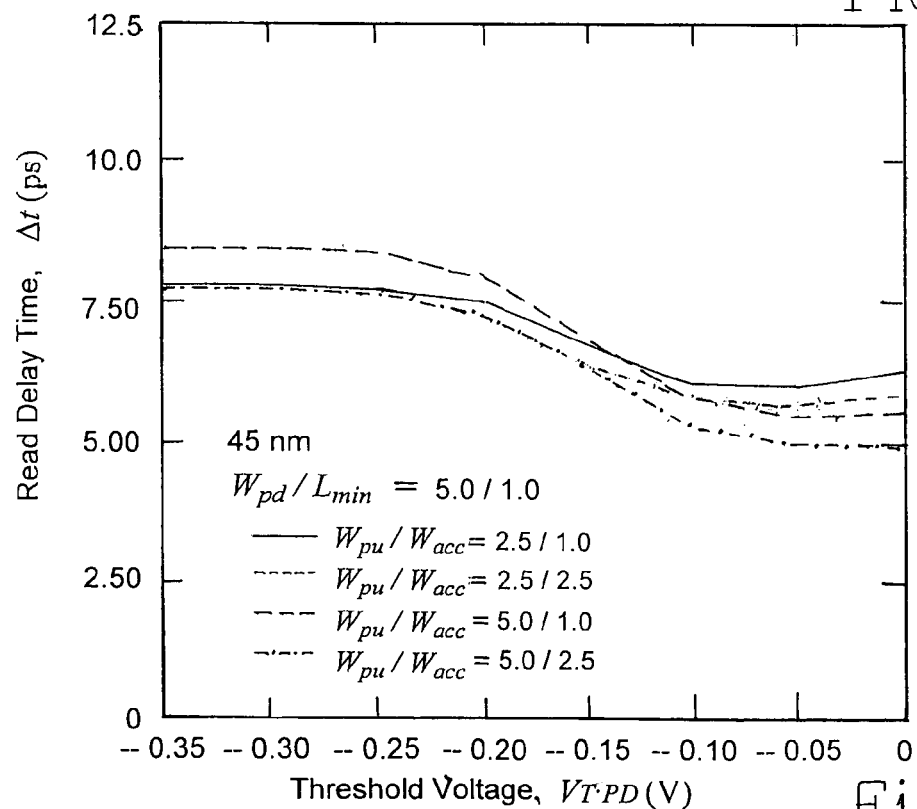
FIG. 11H is another graph of read delay time versus threshold voltage for a 45 nm node according to the subject matter described herein.
Figure 12C:
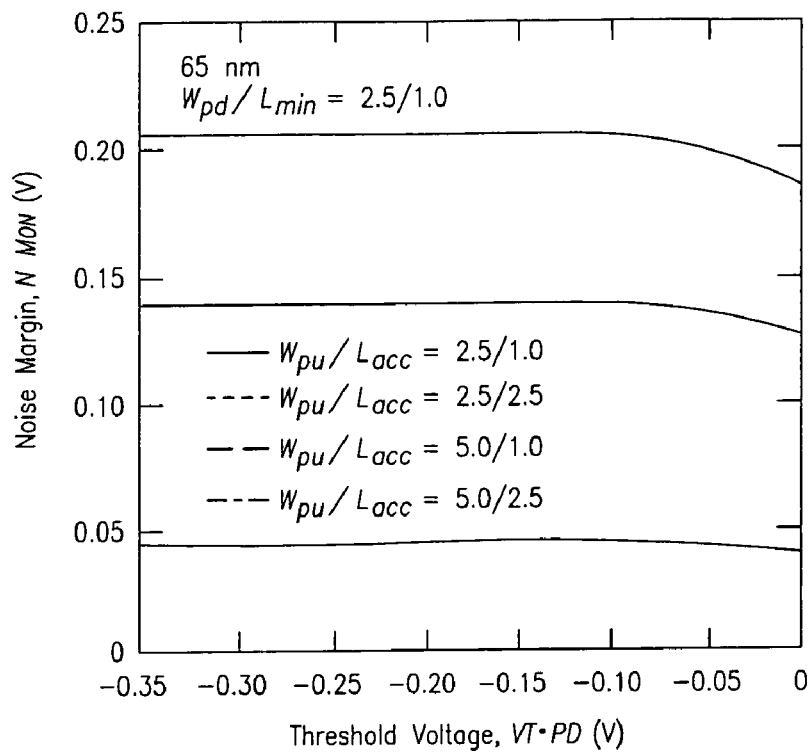
FIG. 12C is a graph of noise margin versus threshold voltage for a 65 nm node and access transistors on according to the subject matter described herein.
Figure 12D:
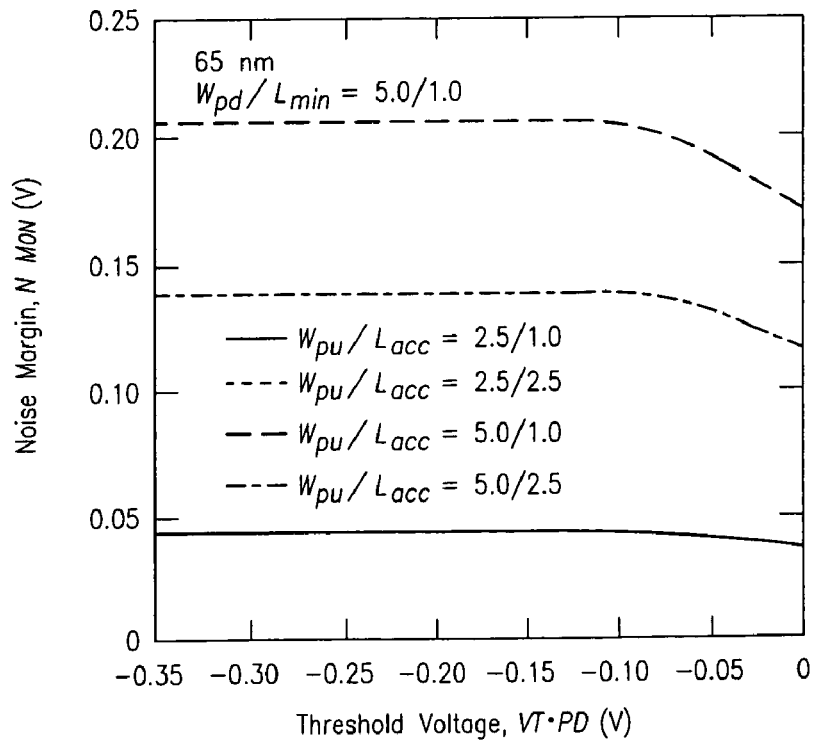
FIG. 12D is another graph of noise margin versus threshold voltage for a 65 nm node and access transistors on according to the subject matter described herein.
Figure 12E:
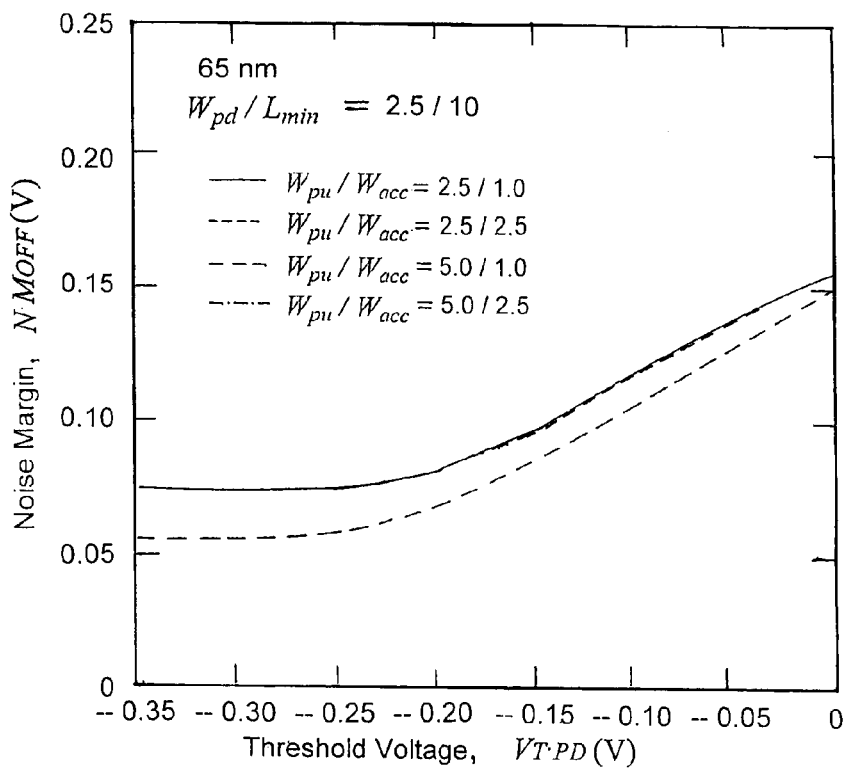
FIG. 12E is a graph of noise margin versus threshold voltage for a 65 nm node and access transistors off according to the subject matter described herein.
Figure 12F:
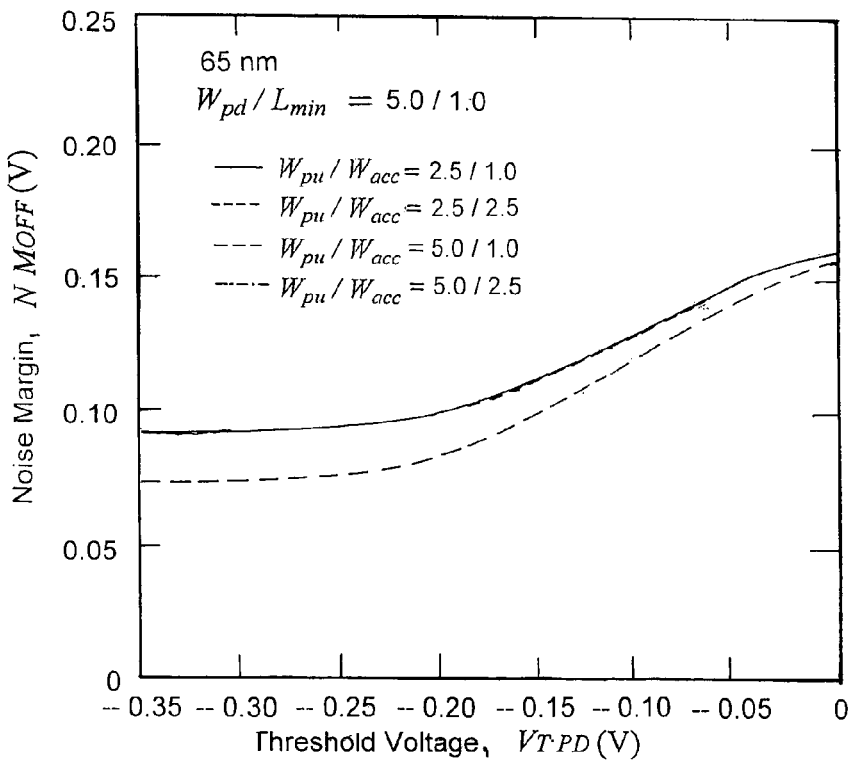
FIG. 12F is another graph of noise margin versus threshold voltage for a 65 nm node and access transistors off according to the subject matter described herein.
Figure 12G:
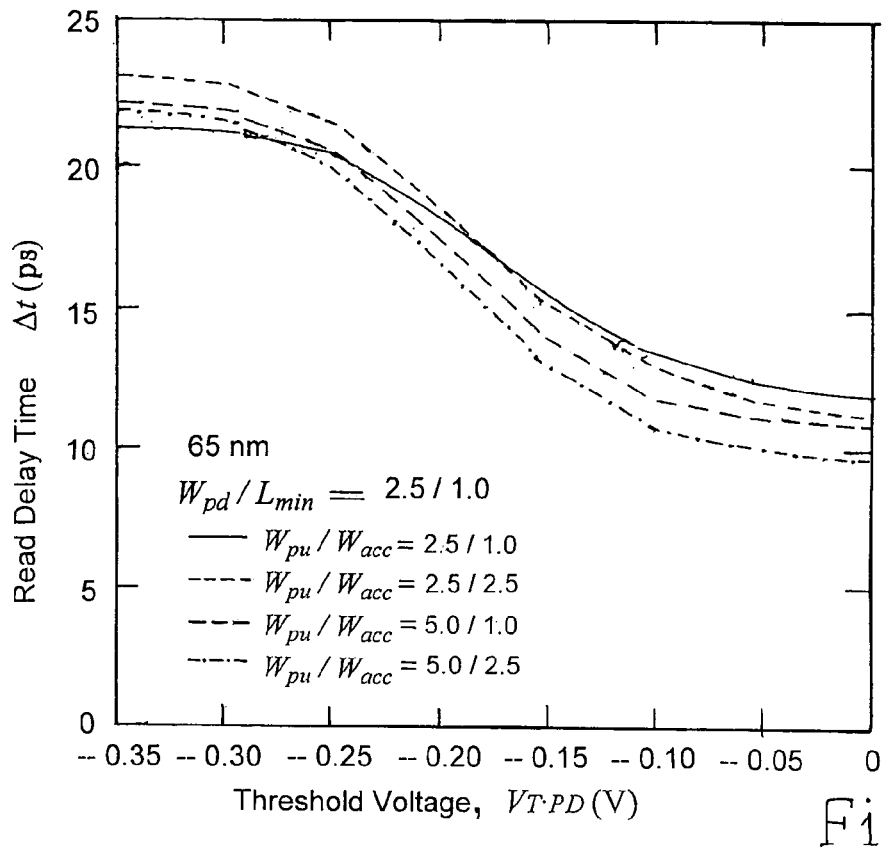
FIG. 12G is a graph of read delay time versus threshold voltage for a 65 nm node according to the subject matter described herein.
Figure 12H:
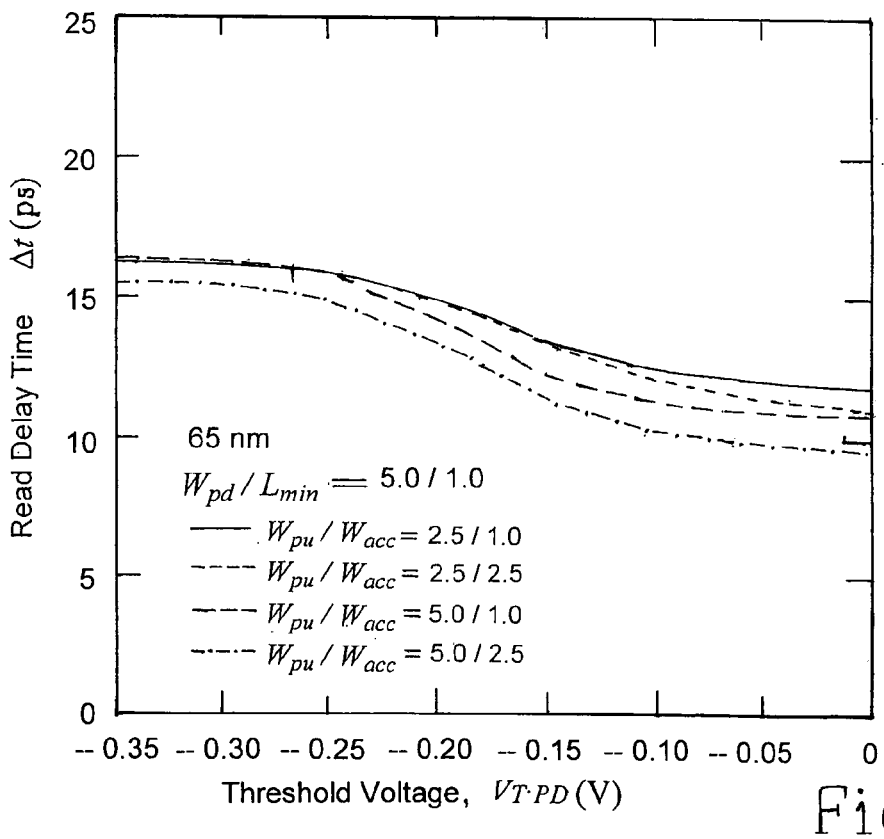
FIG. 12H is another graph of read delay time versus threshold voltage for a 65 nm node according to the subject matter described herein.

FIGS. 10G and 10H show the effect of SRAM cell variations on read access delay. Read access delay time is referred to herein as the time required for the SRAM cell to generate a 0.05 $V_{DD}$ differential signal between the bit lines. Reducing the threshold voltage of the pull-down transistors can reduce the access delay because logic "0" becomes closer to 0 V, which can increase the gate drive of the pull-up transistors. The increased gate drive for the pull-up the pull-up PMOSFETs can result in larger current drive for the pull-up PMOSFET. Increased access delay times can result from increasing the access transistor length for increasing the resistance of the access transistors. Increasing the width of the pull-down transistor can improve the logic "0" voltage and lead to increased gate drives for the pull-up PMOSFET, which results in reduced access delay times. Read delays on the order of 0.02 ns can be provided with SRAM cells having $L_{acc}=L_{min}$.

TABLE 1

SRAM Cell Variables

| Generation | $W_{pu\ nm} \times L_{min}$ | $W_{pd} \times L_{min}$ | $W_{acc} \times L_{min}$ | $V_{th-PD}$ (V) |
|---|---|---|---|---|
| 35 nm | 2.5 | 2.5 | 1 | $-0.05$ |
| 45 nm | 2.5 | 2.5 | 1 | $-0.10$ |
| 65 nm | 5.0 | 2.5 | 1 | $-0.15$ |

FIGS. 11A-11H and 12A-12H illustrate graphs of tradeoff curves for SRAM cells having a 45 nm node and a 65 nm node, respectively.

Table 2 below shows the performance of 35 nm, 45 nm, and 65 nm node SRAM cells.

TABLE 2

SRAM Cell Performance

| Generation | Static Power (W) | NM (On) (V) | NM (Off) (V) | $T_{read}$ (s) (ps) | Area |
|---|---|---|---|---|---|
| 35 nm | $2.1\ 10^{-06}$ | 0.09 | 0.14 | 17 | 12 |
| 45 nm | $8.6\ 10^{-07}$ | 0.11 | 0.12 | 6.5 | 12 |
| 65 nm | $3.5\ 10^{-08}$ | 0.21 | 0.084 | 14 | 17 |

The Area column of Table 2 provides a measure of the area of the SRAM cell in terms of the sums of widths of the transistors in the cell. For example, for the 65 nm SRAM cell, the device sizes are as follows: $W_{pu}=5\ L_{min}$, $W_{pd}=2.5\ L_{min}$, and $W_{acc}=L_{min}$. The area of this cell can be approximated with the following equation $\Sigma(\text{Width})=2*(W_{pu}+W_{pd}+W_{acc})$.

It will be understood that various details of the subject matter disclosed herein may be changed without departing from the scope of the disclosed subject matter. Furthermore, the foregoing description is for the purpose of illustration only, and not for the purpose of limitation, as the subject matter disclosed herein is defined by the claims as set forth hereinafter.

What is claimed is:

1. A static random access memory (SRAM) cell comprising:
    (a) a latch including first and second p-channel enhancement-type metal-oxide semiconductor field-effect transistors (PMOSFETs) for storing data, a gate of the first PMOSFET is connected to a drain of the second PMOSFET at a first memory node, and a gate of the second PMOSFET is connected to a drain of the first PMOSFET at a second memory node;

(b) third and fourth PMOSFETs forming a pull-down circuit, a gate and a source of the third PMOSFET are connected to the first memory node, and a gate and a source of the fourth PMOSFET are connected to the second memory node; and (c) access circuitry for accessing data at the first and second memory nodes for read or write operations.

2. The SRAM cell of claim 1 comprising a voltage source connected to sources of the first and second PMOSFETs.

3. The SRAM cell of claim 1 comprising a ground voltage connected to drains of the third and fourth PMOSFETs.

4. The SRAM cell of claim 1 wherein the access circuitry includes fifth and sixth PMOSFETs for connecting the first and second memory nodes to bit lines, and wherein gates of the fifth and sixth PMOSFETs are connected to a word line.

5. The SRAM cell of claim 4 wherein a source of the fifth PMOSFET is connected to the second memory node, and wherein a source of the sixth PMOSFET is connected to the first memory node.

6. The SRAM cell of claim 5 wherein the bit lines include high and low bit lines, wherein a drain of the fifth PMOSFET is connected to the high bit line, and wherein a drain of the sixth PMOSFET is connected to the low bit line.

7. A memory cell array comprising:
(a) a plurality of SRAM cells each comprising:
  (i) a latch including first and second PMOSFETs for storing data, a gate of the first PMOSFETs is connected to a drain of the second PMOSFET at a first memory node, and a gate of the second PMOSFET is connected to a drain of the first PMOSFET at a second memory node; and
  (ii) third and fourth PMOSFETs forming a pull-down circuit, a gate and a source of the third PMOSFET are connected to the first memory node, and a gate and a source of the fourth PMOSFET are connected to the second memory node; and
(b) access circuitry for selectively accessing the memory nodes of different
SRAM cells for read and write operations.

8. The memory cell array of claim 7 comprising a voltage source connected to the sources of the first and second PMOSFETs of the plurality of SRAM cells.

9. The memory cell array of claim 7 comprising a ground voltage connected to drains of the third and fourth PMOSFETs of the plurality of SRAM cells.

10. The memory cell array of claim 7 comprising a plurality of bit lines and a plurality of word lines, wherein the access circuitry includes fifth and sixth PMOSFETs for connecting the first and second memory nodes to bit lines, and wherein gates of the fifth and sixth PMOSFETs are connected to the plurality of word lines.

11. The memory cell array of claim 10 wherein sources of the fifth PMOSFETs are connected to the second memory nodes, and where sources of the sixth PMOSFETs are connected to the second memory nodes.

12. The memory cell array of claim 11 wherein the bit lines include high and low bit lines, wherein drains of the fifth PMOSFETs are connected to the high bit lines, and wherein drains of the sixth PMOSFETs are connected to the low bit lines.

13. A method for storing data, the method comprising:
(a) providing an SRAM cell comprising:

(i) a latch including first and second PMOSFETs for storing data, a gate of the first PMOSFET is connected to a drain of the second PMOSFET at a first memory node, and a gate of the second PMOSFET is connected to a drain of the first PMOSFET at a second memory node;
  (ii) third and fourth PMOSFETs forming a pull-down circuit, a gate and a source of the third PMOSFET are connected to the first memory node, and a gate and a source of the fourth PMOSFET are connected to the second memory node; and
  (iii) access circuitry for accessing data at the first and second memory nodes for read or write operations; and
(b) powering the first, second, third and fourth PMOSFETs for storing data at the first and second memory nodes.

14. The method of claim 13 wherein powering the first, second, third and fourth PMOSFETs includes applying a voltage differential between the sources of the first and second PMOSFETs and the drains of the third and fourth PMOSFETs.

15. The method of claim 13 wherein the access circuitry includes fifth and sixth PMOSFETs connected to the first and second memory nodes, and the method comprises applying a signal to gates of the fifth and sixth PMOSFETs for read or write operations.

16. The method of claim 13 comprising precharging bit lines connected to the access circuitry.

17. The method of claim 16 wherein precharging bit lines includes precharging the bit lines to 0 volts.

18. The method of claim 13 comprising accessing data on the first and second memory nodes for a read operation.

19. The method of claim 18 comprising reading the data on the first and second memory nodes to bit lines, and comprising amplifying the data on the bit lines.

20. The method of claim 13 comprising providing data on bit lines for a write operation.

21. The method of claim 20 comprising accessing the first and second memory nodes, and writing the data on the bit lines to the first and second memory nodes.

22. A method for storing data, the method comprising:
(a) providing a memory cell array comprising:
  (i) a plurality of SRAM cells each including a latch having first and second PMOSFETs for storing data, a gate of the first PMOSFETs is connected to a drain of the second PMOSFET at a first memory node, and a gate of the second PMOSFET is connected to a drain of the first PMOSFET at a second memory node, and each of the SRAM cells including third and fourth PMOSFETs forming a pull-down circuit, a gate and a source of the third PMOSFET are connected to the first memory node, and a gate and a source of the fourth PMOSFET are connected to the second memory node; and
  (ii) access circuitry for selectively accessing the memory nodes of different SRAM cells for read and write operations; and
(b) powering the first, second, third and fourth PMOSFETs of the plurality of SRAM cells for storing a plurality of data at the first and second memory nodes.

23. The method of claim 22 wherein powering the first, second, third and fourth PMOSFETs includes applying a voltage differential between the sources of the first and second PMOSFETs and the drains of the third and fourth PMOSFETs.

24. The method of claim 22 wherein the access circuitry includes fifth and sixth PMOSFETs connected to the first and second memory nodes, and the method comprises applying a signal to gates of the fifth and sixth PMOSFETs for read or write operations.

25. The method of claim 22 comprising precharging bit lines connected to the access circuitry.

26. The method of claim 25 wherein precharging bit lines includes precharging the bit lines to 0 volts.

27. The method of claim 22 comprising accessing data on the first and second memory nodes of a selected one of the SRAM cells for a read operation.

28. The method of claim 27 comprising reading the data on the first and second memory nodes of the selected one of the SRAM cells, and comprising amplifying the data on the bit lines.

29. The method of claim 22 comprising providing data on bit lines for a write operation.

30. The method of claim 29 comprising accessing the first and second memory nodes of a selected one of the SRAM cells, and writing the data on the bit lines to the first and second memory nodes.

* * * * *